US011237484B2

(12) United States Patent
Zijp

(10) Patent No.: US 11,237,484 B2
(45) Date of Patent: Feb. 1, 2022

(54) METROLOGY TOOLS COMPRISING APLANATIC OBJECTIVE SINGLET

(71) Applicant: ASML Netherlands B.V., Veldhoven (NL)

(72) Inventor: Ferry Zijp, Nuenen (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/875,012

(22) Filed: May 15, 2020

(65) Prior Publication Data
US 2020/0363727 A1 Nov. 19, 2020

(30) Foreign Application Priority Data
May 17, 2019 (EP) .................................... 19175086

(51) Int. Cl.
| H01L 21/027 | (2006.01) |
| G03F 7/20 | (2006.01) |
| G01N 21/956 | (2006.01) |

(52) U.S. Cl.
CPC ..... *G03F 7/7015* (2013.01); *G01N 21/95607* (2013.01); *G03F 7/20* (2013.01); *G03F 7/70633* (2013.01); *H01L 21/0274* (2013.01)

(58) Field of Classification Search
CPC .......... G03F 7/70715; G03F 7/707633; G03F 7/7015; G03F 7/70763; H01L 21/0274; H01L 21/95607
USPC .............................. 356/237.1, 445, 500, 513
See application file for complete search history.

(56) References Cited

U.S. PATENT DOCUMENTS

| 4,712,886 A | | 12/1987 | Mercado |
| 5,208,648 A | * | 5/1993 | Batchelder ......... G01N 21/9505 356/237.1 |
| 5,754,514 A | * | 5/1998 | Guerra .................. B82Y 10/00 250/216 |
| 6,952,253 B2 | | 10/2005 | Lof et al. |
| 6,961,116 B2 | | 11/2005 | Den Boef et al. |
| 7,265,364 B2 | | 9/2007 | Teunissen et al. |

(Continued)

FOREIGN PATENT DOCUMENTS

| CN | 109752842 A | 5/2019 |
| EP | 1 628 164 A2 | 2/2006 |

(Continued)

OTHER PUBLICATIONS

Hristov, B.A., "Analytical solution of Wassermann-Wolf differential equations for optical system aplanatism," Intl. Conf. on Holography, Optical Recording, and Processing of Information, Proc. of SPIE, vol. 6252. Jun. 9, 2006; pp. 1-5.

(Continued)

*Primary Examiner* — Hung Nguyen
(74) *Attorney, Agent, or Firm* — Sterne, Kessler, Goldstein & Fox P.L.L.C.

(57) ABSTRACT

A metrology tool, an aplanatic singlet lens, and a method of designing an aplanatic singlet lens are provided. The metrology tool is for determining a characteristic of a structure on a substrate. The metrology tool comprises an optical detection system for detecting radiation over a wavelength range. The optical detection system comprises an aplanatic singlet lens for focusing the radiation on to a detector. The aplanatic singlet lens has a n aplanatic wavelength which is within the wavelength range.

11 Claims, 6 Drawing Sheets

(56) References Cited

U.S. PATENT DOCUMENTS

| | | |
|---|---|---|
| 7,646,471 B2 | 1/2010 | Teunissen et al. |
| 7,701,577 B2 | 4/2010 | Straaijer et al. |
| 7,791,724 B2 | 9/2010 | Den Boef et al. |
| 8,115,926 B2 | 2/2012 | Straaijer |
| 8,553,227 B2 | 10/2013 | Jordanoska |
| 8,681,312 B2 | 3/2014 | Straaijer |
| 8,692,994 B2 | 4/2014 | Straaijer |
| 8,724,109 B2 | 5/2014 | Setija et al. |
| 8,792,096 B2 | 7/2014 | Straaijer |
| 8,797,554 B2 | 8/2014 | Straaijer |
| 8,823,922 B2 | 9/2014 | Den Boef et al. |
| 2009/0195768 A1 | 8/2009 | Bijnen et al. |
| 2010/0079748 A1 | 4/2010 | Ryzhikov |
| 2010/0233600 A1 | 9/2010 | Den Boef et al. |
| 2010/0328655 A1 | 12/2010 | Den Boef |
| 2011/0026032 A1 | 2/2011 | Den Boef et al. |
| 2011/0102753 A1 | 5/2011 | Van De Kerkhof et al. |
| 2011/0249244 A1 | 10/2011 | Leewis et al. |
| 2012/0044470 A1 | 2/2012 | Smilde et al. |
| 2013/0162996 A1 | 6/2013 | Straaijer et al. |
| 2013/0342831 A1 | 12/2013 | Levinski et al. |
| 2015/0198524 A1* | 7/2015 | Sapiens ............. G01N 21/4788 356/445 |
| 2015/0261097 A1 | 9/2015 | Mathijssen et al. |
| 2016/0161863 A1 | 6/2016 | Den Boef et al. |
| 2016/0370717 A1 | 12/2016 | Den Boef et al. |

FOREIGN PATENT DOCUMENTS

| | | |
|---|---|---|
| EP | 2 042 907 A1 | 4/2009 |
| EP | 2 169 466 A1 | 3/2010 |
| EP | 3 614 207 A1 | 2/2020 |
| JP | 2010-087506 A | 4/2010 |
| TW | 200938964 A | 9/2009 |
| WO | WO 2011/012624 A1 | 2/2011 |
| WO | WO 2016/102127 A1 | 6/2016 |

OTHER PUBLICATIONS

Wassermann et al., "On the Theory of Aplanatic Aspheric Systems," Proc. of the Physical Society, vol. 62, No. 1, Feb. 21, 1948; pp. 2-8.
Welford, W.T., "Aberrations of Optical Systems," The Adam Hilger Series on Optics an Optoelectronics, Jan. 1, 1986; pp. 226-232.
Valencia-Estrada et al., "Singlet lenses free of all orders of spherical aberration," Proc. of the Royal Society A: Mathematical, Physical and Engineering Sciences, vol. 471, No. 2175, Aug. 3, 2015; pp. 1-23.
Szulc, A., "Improved solution for the cemented doublet," Optical Society of America, Applied Optics, vol. 35, No. 19, Jul. 1, 1996; pp. 3548-3558.
International Search Report and Written Opinion of the International Search Authority directed to related International Patent Application No. PCT/EP2020/061185, dated Jul. 20, 2020; 13 pages.

* cited by examiner

METROLOGY TOOLS COMPRISING APLANATIC OBJECTIVE SINGLET

FIELD

The present invention relates to metrology tools for determining one or more characteristics of a structure on a substrate. Specifically, it relates to optical detection systems comprising aplanatic singlet objective lenses within such metrology tools.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") at a patterning device (e.g., a mask) onto a layer of radiation-sensitive material (resist) provided on a substrate (e.g., a wafer).

To project a pattern on a substrate a lithographic apparatus may use electromagnetic radiation. The wavelength of this radiation determines the minimum size of features which can be formed on the substrate. Typical wavelengths currently in use are 365 nm (i-line), 248 nm, 193 nm and 13.5 nm. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

Low-$k_1$ lithography may be used to process features with dimensions smaller than the classical resolution limit of a lithographic apparatus. In such process, the resolution formula may be expressed as $CD = k_1 \times \lambda / NA$, where $\lambda$, is the wavelength of radiation employed, NA is the numerical aperture of the projection optics in the lithographic apparatus, CD is the "critical dimension" (generally the smallest feature size printed, but in this case half-pitch) and $k_1$ is an empirical resolution factor. In general, the smaller $k_1$ the more difficult it becomes to reproduce the pattern on the substrate that resembles the shape and dimensions planned by a circuit designer in order to achieve particular electrical functionality and performance. To overcome these difficulties, sophisticated fine-tuning steps may be applied to the lithographic projection apparatus and/or design layout. These include, for example, but not limited to, optimization of NA, customized illumination schemes, use of phase shifting patterning devices, various optimization of the design layout such as optical proximity correction (OPC, sometimes also referred to as "optical and process correction") in the design layout, or other methods generally defined as "resolution enhancement techniques" (RET). Alternatively, tight control loops for controlling a stability of the lithographic apparatus may be used to improve reproduction of the pattern at low k1.

Apparatus used for lithographic processes and/or related metrology processes comprise complex optical systems for guiding and controlling radiation within an apparatus. These optical systems can be very complex in order to meet stringent performance requirements placed on the apparatus they form part of. Performance of optical systems is often wavelength dependent, and making optics that meet performance requirements over a broader wavelength ranges may also add to the complexity of the optical system. As a result, the optical systems inside apparatus may have a significant size and/or cost, and may be challenging to produce. Described herein are methods and systems to address some of the challenges related to optical systems for lithographic, metrology, and/or inspection apparatus.

SUMMARY

According to the present disclosure there is provided a metrology tool for determining a characteristic of a structure on a substrate. The metrology tool may comprise an optical detection system for detecting radiation over a wavelength range, wherein the optical detection system comprises an aplanatic singlet lens for focusing the radiation on to a detector, wherein the aplanatic singlet lens has an aplanatic wavelength which is within the wavelength range.

Optionally, the aplanatic singlet lens may comprise a front surface and a back surface having on-axis curvatures at which a spherochromatic aberration of the aplanatic singlet lens is within 20% of a minimum spherochromatic aberration. The aplanatic singlet lens may further comprise a plurality of other lens characteristics, wherein the minimum spherochromatic aberration is the minimum spherochromatic aberration for all aplanatic singlet lenses having the same other lens characteristics.

Optionally, the plurality of other lens characteristics may comprise at least two of: a material, a thickness, a numerical aperture, a focal length, and a magnification.

Optionally, the on-axis curvatures may be expressed as a Coddington shape factor.

Optionally, the spherochromatic aberration may be a wavefront aberration and may comprise spherochromatic aberration root mean square (RMS) values.

Optionally, the spherochromatic aberration of the aplanatic singlet lens may be wavelength dependent. The spherochromatic aberration with the highest value across the wavelength range may be taken to represent the spherochromatic aberration of the aplanatic singlet lens.

Optionally, the aplanatic singlet lens may be configured to be aplanatic for an aplanatic wavelength in relation to the wavelength range. The aplanatic wavelength may be provided at a point at which the highest spherochromatic aberration for wavelengths shorter than the aplanatic wavelength in the broadband wavelength range falls within a predetermined range of the highest spherochromatic aberration for wavelengths longer than the aplanatic wavelength in the broadband wavelength range.

Optionally, the highest spherochromatic aberration may have an RMS value between 0.05 wavelengths and 26 wavelengths.

Optionally, the predetermined range may be 0.02 wavelengths RMS.

Optionally, the radiation may comprise a plurality of wavelengths in broadband wavelength range which the detector is configured to detect.

Optionally, the radiation may comprise a wavelength range with a bandwidth between 1 nm and 5 nm.

Optionally, the aplanatic singlet lens may be bi-aspheric.

Optionally, the material may be a low-dispersion material with an Abbe number greater than 63.

Optionally, the low dispersion material may have an Abbe number greater than 90.

Optionally, the material may be one of $CaF_2$, $BaF_2$, LiF, $BaLiF_3$, $SrF_2$, $Lu_3Al_5O_{12}$, or $Y_3Al_5O_{12}$.

Optionally, the numerical aperture may be less than 0.95, greater than 0.2, and optionally is 0.5.

Optionally, the magnification may have a magnitude from 10 to 100.

Optionally, the thickness may have a value between 1 mm and 10 mm.

Optionally, the principal focal length may have a value between 1 mm and 20 mm.

Optionally, the broadband wavelength range may comprise wavelengths from deep ultraviolet radiation to infrared radiation.

Optionally, the broadband wavelength range may comprise a range from 200 nm to 2000 nm.

Optionally, the aplanatic singlet lens does not comprise an anti-reflective coating in use.

Optionally, the aplanatic singlet lens may be an objective lens.

Optionally, the characteristic to be determined may be overlay.

Optionally, the metrology tool may be a multi-wavelength metrology sensor.

According to another aspect of the disclosure there is provided an aplanatic singlet lens for receiving radiation over a wavelength range. The aplanatic singlet lens may be configured to be aplanatic for an aplanatic wavelength. The aplanatic singlet lens may comprise a front surface and a back surface having on-axis curvatures at which a spherochromatic aberration of the aplanatic singlet lens is within 20% of a minimum spherochromatic aberration, and a plurality of other lens characteristics. The minimum spherochromatic aberration may be the minimum spherochromatic aberration for all aplanatic singlet lenses having the same other lens characteristics.

Optionally, the aplanatic wavelength may be provided at a point at which the highest spherochromatic aberration for wavelengths shorter than the aplanatic wavelength in the broadband wavelength range falls within a predetermined range of the highest spherochromatic aberration for wavelengths longer than the aplanatic wavelength in the broadband wavelength range.

Optionally, the predetermined range may be 0.02 wavelengths RMS.

Optionally, the highest spherochromatic aberration may have an RMS value between 0.05 wavelengths and 26 wavelengths.

According to another aspect of the present disclosure there is provided a lithographic apparatus comprising a metrology tool as described above.

According to another aspect of the present disclosure there is provided a method of designing an aplanatic singlet lens configured for use across a wavelength range. The method may comprise setting a plurality of lens characteristics. The method may further comprise setting an aplanatic wavelength, wherein the aplanatic wavelength falls within the wavelength range. The method may further comprise selecting, based on the plurality of lens characteristics and the aplanatic wavelength, on-axis curvatures for the aplanatic singlet lens. The method may further comprise determining, based on the on-axis curvatures, the aplanatic wavelength, and the plurality of other lens characteristics, spherochromatic aberrations for the aplanatic singlet lens. The method may further comprise comparing the spherochromatic aberrations to a predetermined minimum spherochromatic value; The method may further comprise, if the spherochromatic aberration falls outside a 20% range of the predetermined minimum spherochromatic value, selecting different on-axis curvatures and repeating the steps in this paragraph.

Optionally, determining the spherochromatic aberrations may comprise determining spherochromatic aberrations across the wavelength range. The method may further comprise determining whether the spherochromatic aberrations are balanced across the wavelength range. The method may further comprise setting a different aplanatic wavelength if the spherochromatic aberrations are not balanced across the wavelength range.

BRIEF DESCRIPTION OF THE DRAWINGS

Embodiments of the invention will now be described, by way of example only, with reference to the accompanying drawings, in which.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm). The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
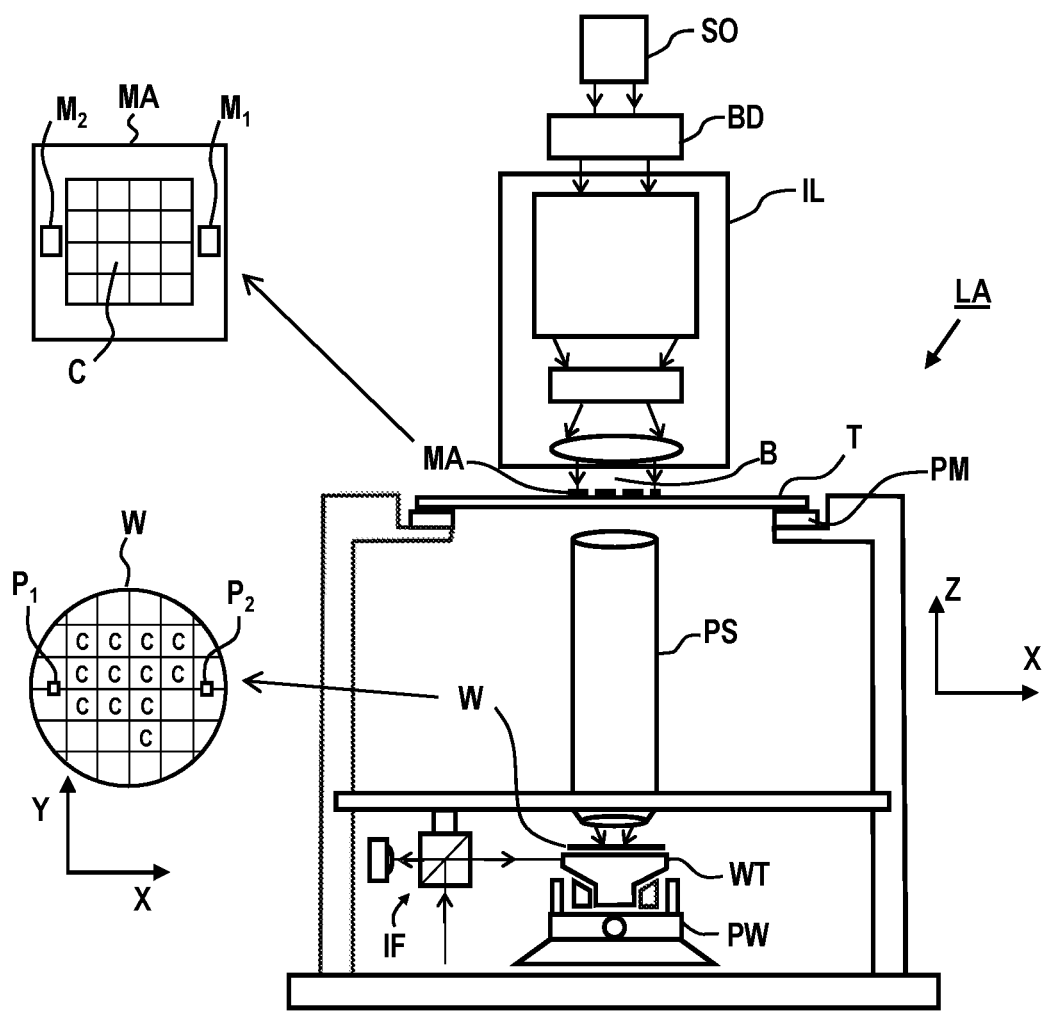
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) T constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

Figure 2:
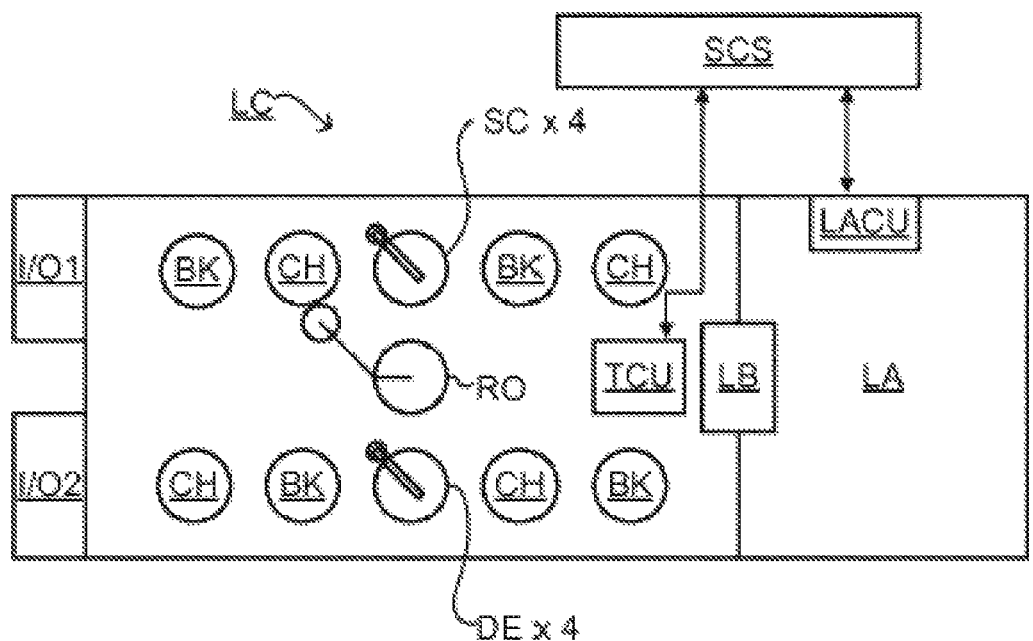
FIG. 2 depicts a schematic representation of a lithographic cell.

As shown in FIG. 2 the lithographic apparatus LA may form part of a lithographic cell LC, also sometimes referred to as a lithocell or (litho)cluster, which often also includes apparatus to perform pre- and post-exposure processes on a substrate W. Conventionally these include spin coaters SC to deposit resist layers, developers DE to develop exposed resist, chill plates CH and bake plates BK, e.g. for conditioning the temperature of substrates W e.g. for conditioning solvents in the resist layers. A substrate handler, or robot, RO picks up substrates W from input/output ports I/O1, I/O2, moves them between the different process apparatus and delivers the substrates W to the loading bay LB of the lithographic apparatus LA. The devices in the lithocell, which are often also collectively referred to as the track, are typically under the control of a track control unit TCU that in itself may be controlled by a supervisory control system SCS, which may also control the lithographic apparatus LA, e.g. via lithography control unit LACU.

In order for the substrates W exposed by the lithographic apparatus LA to be exposed correctly and consistently, it is desirable to inspect substrates to measure properties of patterned structures, such as overlay errors between subsequent layers, line thicknesses, critical dimensions (CD), etc. For this purpose, inspection tools (not shown) may be included in the lithocell LC. If errors are detected, adjustments, for example, may be made to exposures of subsequent substrates or to other processing steps that are to be performed on the substrates W, especially if the inspection is done before other substrates W of the same batch or lot are still to be exposed or processed.

An inspection apparatus, which may also be referred to as a metrology apparatus, is used to determine properties of the substrates W, and in particular, how properties of different substrates W vary or how properties associated with different layers of the same substrate W vary from layer to layer. The inspection apparatus may alternatively be constructed to identify defects on the substrate W and may, for example, be part of the lithocell LC, or may be integrated into the lithographic apparatus LA, or may even be a stand-alone device. The inspection apparatus may measure the properties on a latent image (image in a resist layer after the exposure), or on a semi-latent image (image in a resist layer after a post-exposure bake step PEB), or on a developed resist image (in which the exposed or unexposed parts of the resist have been removed), or even on an etched image (after a pattern transfer step such as etching).

Figure 3:
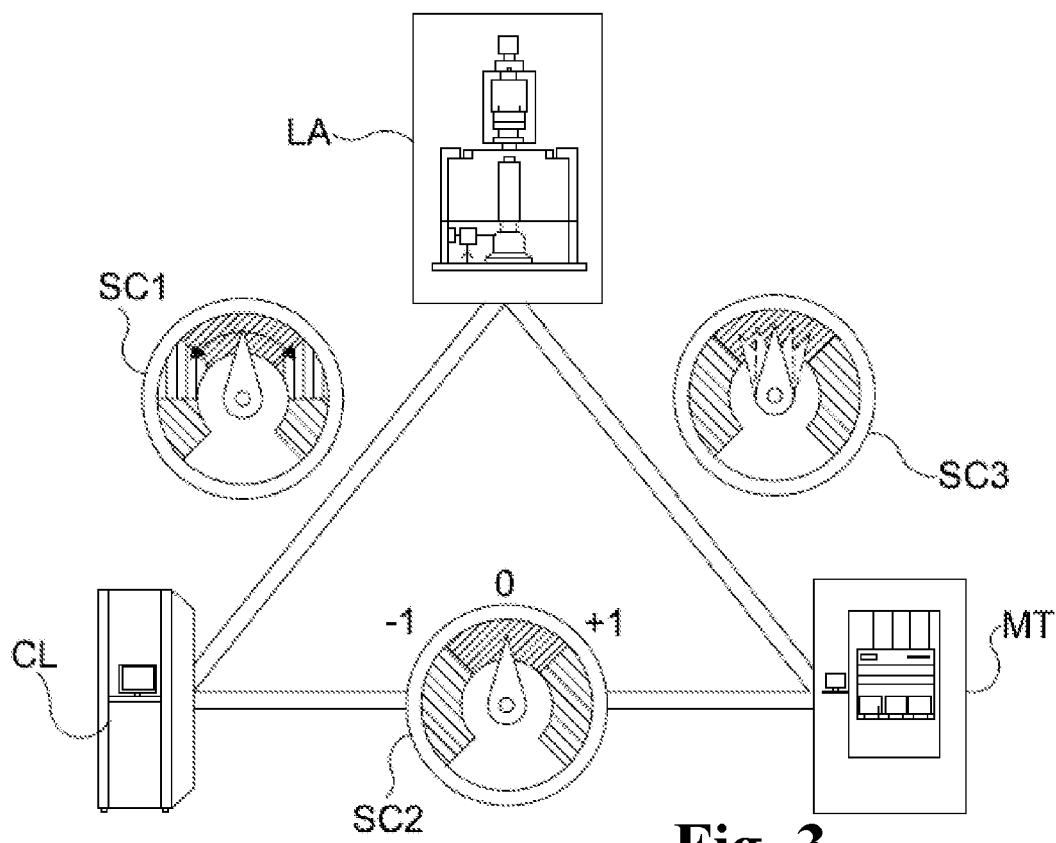
FIG. 3 depicts a schematic representation of holistic lithography, representing a cooperation between three key technologies to optimize semiconductor manufacturing.

Typically the patterning process in a lithographic apparatus LA is one of the most critical steps in the processing which requires high accuracy of dimensioning and placement of structures on the substrate W. To ensure this high accuracy, three systems may be combined in a so called "holistic" control environment as schematically depicted in FIG. 3. One of these systems is the lithographic apparatus LA which is (virtually) connected to a metrology tool MT (a second system) and to a computer system CL (a third system). The key of such "holistic" environment is to optimize the cooperation between these three systems to enhance the overall process window and provide tight control loops to ensure that the patterning performed by the lithographic apparatus LA stays within a process window.

The process window defines a range of process parameters (e.g. dose, focus, overlay) within which a specific manufacturing process yields a defined result (e.g. a functional semiconductor device)—typically within which the process parameters in the lithographic process or patterning process are allowed to vary.

The computer system CL may use (part of) the design layout to be patterned to predict which resolution enhancement techniques to use and to perform computational lithography simulations and calculations to determine which mask layout and lithographic apparatus settings achieve the largest overall process window of the patterning process (depicted in FIG. 3 by the double arrow in the first scale SC1). Typically, the resolution enhancement techniques are arranged to match the patterning possibilities of the lithographic apparatus LA. The computer system CL may also be used to detect where within the process window the lithographic apparatus LA is currently operating (e.g. using input from the metrology tool MT) to predict whether defects may be present due to e.g. sub-optimal processing (depicted in FIG. 3 by the arrow pointing "0" in the second scale SC2).

The metrology tool MT may provide input to the computer system CL to enable accurate simulations and predictions, and may provide feedback to the lithographic apparatus LA to identify possible drifts, e.g. in a calibration status of the lithographic apparatus LA (depicted in FIG. 3 by the multiple arrows in the third scale SC3).

In lithographic processes, it is desirable to make frequently measurements of the structures created, e.g., for process control and verification. Tools to make such measurement are typically called metrology tools MT. Different types of metrology tools MT for making such measurements are known, including scanning electron microscopes or various forms of scatterometer metrology tools MT. Scatterometers are versatile instruments which allow measurements of the parameters of a lithographic process by having a sensor in the pupil or a conjugate plane with the pupil of the objective of the scatterometer, measurements usually referred as pupil based measurements, or by having the sensor in the image plane or a plane conjugate with the image plane, in which case the measurements are usually referred as image or field based measurements. Such scatterometers and the associated measurement techniques are further described in patent applications US20100328655, US2011102753A1, US20120044470A, US20110249244, US20110026032 or EP1,628,164A, incorporated herein by reference in their entirety. In some metrology setups, sensors may be located near an image plane or near a conjugate plane of the image plane, in order to perform measurements to obtain intensity information from which wavefront aberrations of the imaging system may be reconstructed. Aforementioned scatterometers may measure gratings using light from soft x-ray and visible to near-IR wavelength range.

In a first embodiment, the scatterometer MT is an angular resolved scatterometer. In such a scatterometer reconstruction methods may be applied to the measured signal to reconstruct or calculate properties of the grating. Such reconstruction may, for example, result from simulating interaction of scattered radiation with a mathematical model of the target structure and comparing the simulation results with those of a measurement. Parameters of the mathematical model are adjusted until the simulated interaction produces a diffraction pattern similar to that observed from the real target.

In a second embodiment, the scatterometer MT is a spectroscopic scatterometer MT. In such spectroscopic scatterometer MT, the radiation emitted by a radiation source is directed onto the target and the reflected or scattered radiation from the target is directed to a spectrometer detector, which measures a spectrum (i.e. a measurement of intensity as a function of wavelength) of the specular reflected radiation. From this data, the structure or profile of the target giving rise to the detected spectrum may be reconstructed, e.g. by Rigorous Coupled Wave Analysis and non-linear regression or by comparison with a library of simulated spectra.

In a third embodiment, the scatterometer MT is an ellipsometric scatterometer. The ellipsometric scatterometer allows for determining parameters of a lithographic process by measuring scattered radiation for each polarization states. Such metrology apparatus emits polarized light (such as linear, circular, or elliptic) by using, for example, appropriate polarization filters in the illumination section of the metrology apparatus. A source suitable for the metrology apparatus may provide polarized radiation as well. Various embodiments of existing ellipsometric scatterometers are described in U.S. patent application Ser. Nos. 11/451,599, 11/708,678, 12/256,780, 12/486,449, 12/920,968, 12/922,587, 13/000,229, 13/033,135, 13/533,110 and 13/891,410 incorporated herein by reference in their entirety.

In one embodiment of the scatterometer MT, the scatterometer MT is adapted to measure the overlay of two misaligned gratings or periodic structures by measuring asymmetry in the reflected spectrum and/or the detection configuration, the asymmetry being related to the extent of the overlay. The two (typically overlapping) grating structures may be applied in two different layers (not necessarily consecutive layers), and may be formed substantially at the same position on the wafer. The scatterometer may have a symmetrical detection configuration as described e.g. in co-owned patent application EP1,628,164A, such that any asymmetry is clearly distinguishable. This provides a straightforward way to measure misalignment in gratings. Further examples for measuring overlay error between the two layers containing periodic structures as target is measured through asymmetry of the periodic structures may be found in PCT patent application publication no. WO 2011/012624 or US patent application US 20160161863, incorporated herein by reference in its entirety.

Other parameters of interest may be focus and dose. Focus and dose may be determined simultaneously by scatterometry (or alternatively by scanning electron microscopy) as described in US patent application US2011-0249244, incorporated herein by reference in its entirety. A single structure may be used which has a unique combination of critical dimension and sidewall angle measurements for each point in a focus energy matrix (FEM—also referred to as Focus Exposure Matrix). If these unique combinations of critical dimension and sidewall angle are available, the focus and dose values may be uniquely determined from these measurements.

A metrology target may be an ensemble of composite gratings, formed by a lithographic process, mostly in resist, but also after etch process for example. Typically the pitch and line-width of the structures in the gratings strongly depend on the measurement optics (in particular the NA of the optics) to be able to capture diffraction orders coming from the metrology targets. As indicated earlier, the diffracted signal may be used to determine shifts between two layers (also referred to 'overlay') or may be used to reconstruct at least part of the original grating as produced by the lithographic process. This reconstruction may be used to provide guidance of the quality of the lithographic process and may be used to control at least part of the lithographic process. Targets may have smaller sub-segmentation which are configured to mimic dimensions of the functional part of the design layout in a target. Due to this sub-segmentation, the targets will behave more similar to the functional part of the design layout such that the overall process parameter measurements resembles the functional part of the design layout better. The targets may be measured in an underfilled mode or in an overfilled mode. In the underfilled mode, the measurement beam generates a spot that is smaller than the overall target. In the overfilled mode, the measurement beam generates a spot that is larger than the overall target. In such overfilled mode, it may also be possible to measure different targets simultaneously, thus determining different processing parameters at the same time.

Overall measurement quality of a lithographic parameter using a specific target is at least partially determined by the measurement recipe used to measure this lithographic parameter. The term "substrate measurement recipe" may include one or more parameters of the measurement itself, one or more parameters of the one or more patterns measured, or both. For example, if the measurement used in a substrate measurement recipe is a diffraction-based optical measurement, one or more of the parameters of the measurement may include the wavelength of the radiation, the polarization of the radiation, the incident angle of radiation relative to the substrate, the orientation of radiation relative to a pattern on the substrate, etc. One of the criteria to select a measurement recipe may, for example, be a sensitivity of one of the measurement parameters to processing variations. More examples are described in US patent application US2016-0161863 and published US patent application US 2016/0370717A1 incorporated herein by reference in its entirety.

Another example metrology tool MT is a topography measurement system {XE "topography measurement system"}, level sensor {XE "level sensor"} or height {XE "height"} sensor {XE "height sensor"}, which may be integrated in the lithographic apparatus, and is arranged to measure a topography of a top surface of a substrate{XE "substrate"} (or wafer{XE "wafer"}). A map of the topography of the substrate, also referred to as height map{XE "height map"}, may be generated from these measurements indicating a height of the substrate as a function of the position on the substrate. This height map may subsequently be used to correct the position of the substrate during transfer of the pattern on the substrate, in order to provide an aerial image{XE "aerial image"} of the patterning device in a properly focus position on the substrate. It will be understood that "height" in this context refers to a dimension broadly out of the plane to the substrate (also referred to as Z-axis). Typically, the level or height sensor performs measurements at a fixed location (relative to its own optical system) and a relative movement between the substrate and the optical system of the level or height sensor results in height measurements at locations across the substrate.

Figure 4:
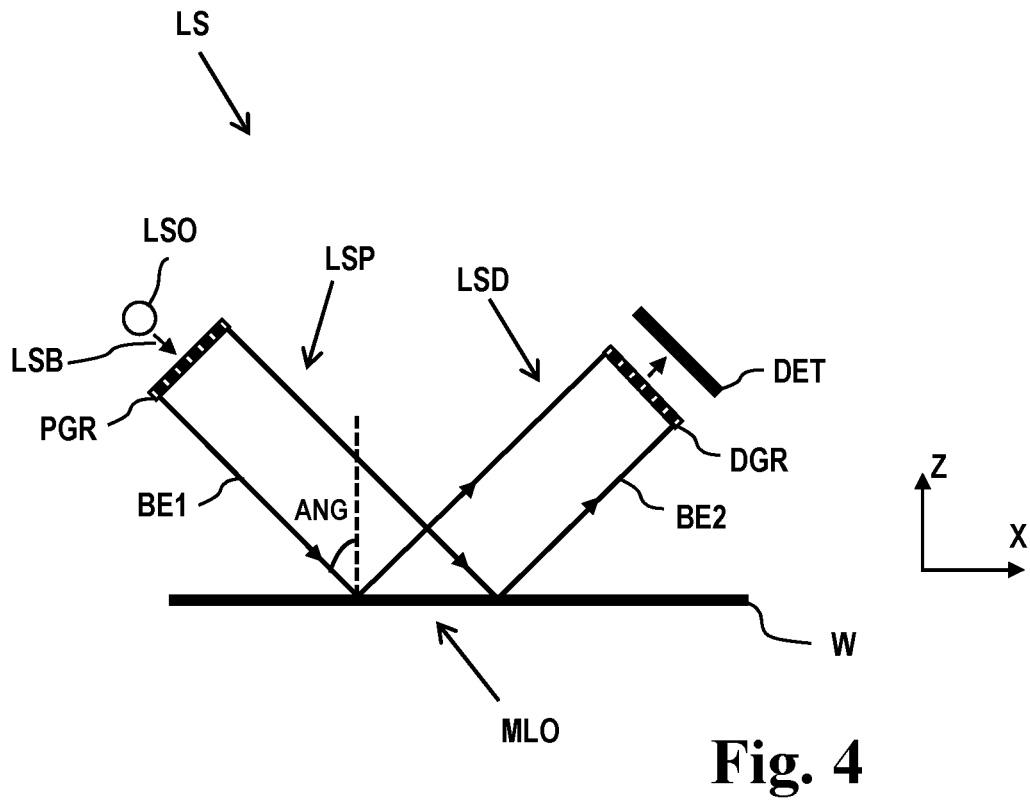
FIG. 4 depicts a schematic representation of a level sensor.

An example of a level or height{XE "height"} sensor{XE "height sensor"} LS as known in the art is schematically shown in FIG. 4, which illustrates only the principles of operation. In this example, the level sensor{XE "level sensor"} comprises an optical system, which includes a projection unit{XE "projection unit"} LSP and a detection unit{XE "detection unit"} LSD. The projection unit LSP comprises a radiation source{XE "radiation source"} LSO providing a beam of radiation LSB which is imparted by a projection grating{XE "projection grating"} PGR of the projection unit LSP. The radiation source LSO may be, for example, a narrowband or broadband radiation source, such as a supercontinuum light source, polarized or non-polarized, pulsed or continuous, such as a polarized or non-polarized laser beam. The radiation source LSO may include a plurality of radiation sources having different colors, or wavelength ranges, such as a plurality of LEDs. The radiation source LSO of the level sensor LS is not restricted to visible radiation, but may additionally or alternatively encompass UV and/or IR radiation and any range of wavelengths suitable to reflect from a surface of a substrate{XE "substrate"}.

The projection grating {XE "projection grating"} PGR is a periodic grating comprising a periodic structure resulting in a beam of radiation BE1 having a periodically varying intensity. The beam of radiation BE1 with the periodically varying intensity is directed towards a measurement location MLO on a substrate{XE "substrate"} W having an angle of incidence ANG with respect to an axis perpendicular (Z-axis) to the incident substrate surface between 0 degrees and 90 degrees, typically between 70 degrees and 80 degrees. At the measurement location MLO, the patterned beam of radiation BE1 is reflected by the substrate W (indicated by arrows BE2) and directed towards the detection unit{XE "detection unit"} LSD.

In order to determine the height{XE "height"} level at the measurement location MLO, the level sensor{XE "level sensor"} further comprises a detection system comprising a detection grating{XE "detection grating"} DGR, a detector DET and a processing unit (not shown) for processing an output signal of the detector DET. The detection grating DGR may be identical to the projection grating {XE "projection grating"} PGR. The detector DET produces a detector output signal indicative of the light received, for example indicative of the intensity of the light received, such as a photodetector, or representative of a spatial distribution of the intensity received, such as a camera. The detector DET may comprise any combination of one or more detector types.

By means of triangulation techniques, the height {XE "height"} level at the measurement location MLO can be determined. The detected height level is typically related to the signal strength as measured by the detector DET, the signal strength having a periodicity that depends, amongst others, on the design of the projection grating {XE "projection grating"} PGR and the (oblique) angle of incidence ANG.

The projection unit {XE "projection unit"} LSP and/or the detection unit {XE "detection unit"} LSD may include further optical elements, such as lenses and/or mirrors, along the path of the patterned beam of radiation between the projection grating {XE "projection grating"} PGR and the detection grating{XE "detection grating"} DGR (not shown).

In an embodiment, the detection grating {XE "detection grating"} DGR may be omitted, and the detector DET may be placed at the position where the detection grating DGR is located. Such a configuration provides a more direct detection of the image of the projection grating{XE "projection grating"} PGR.

In order to cover the surface of the substrate{XE "substrate"} W effectively, a level sensor{XE "level sensor"} LS may be configured to project an array of measurement beams BE1 onto the surface of the substrate W, thereby generating an array of measurement areas MLO or spots covering a larger measurement range.

Various height{XE "height"} sensors of a general type are disclosed for example in U.S. Pat. Nos. 7,265,364 and 7,646,471, both incorporated by reference. A height sensor{XE "height sensor"} using UV radiation instead of visible or infrared radiation is disclosed in US2010233600A1, incorporated by reference. In WO2016102127A1, incorporated by reference, a compact height sensor is described which uses a multi-element detector to detect and recognize the position of a grating image, without needing a detection grating {XE "detection grating"}.

In the manufacture of complex devices, typically many lithographic patterning steps are performed, thereby forming functional features in successive layers on the substrate{XE "substrate"}. A critical aspect of performance of the lithographic apparatus may therefore be the ability to place the applied pattern correctly and accurately in relation to features laid down in previous layers (by the same apparatus or a different lithographic apparatus). For this purpose, the substrate is provided with one or more sets of marks. Each mark{XE "mark"} is a structure whose position can be measured at a later time using a position sensor{XE "position sensor"}, typically an optical position sensor. The position sensor may be referred to as "alignment sensor{XE "alignment sensor"}" and marks may be referred to as "alignment marks{XE "alignment mark"}".

A lithographic apparatus may include one or more (e.g. a plurality of) alignment sensors by which positions of alignment marks {XE "alignment mark"} provided on a substrate{XE "substrate"} can be measured accurately. Alignment (or position) sensors may use optical phenomena such as diffraction and interference to obtain position information from alignment marks{XE "alignment mark"} formed on the substrate. An example of an alignment sensor{XE "alignment sensor"} used in current lithographic apparatus is based on a self-referencing interferometer as described in U.S. Pat. No. 6,961,116. Various enhancements and modifications of the position sensor {XE "position sensor"} have been developed, for example as disclosed in US2015261097A1. The contents of all of these publications are incorporated herein by reference.

A mark{XE "mark"}, or alignment mark, may comprise a series of bars formed on or in a layer provided on the substrate{XE "substrate"} or formed (directly) in the substrate. The bars may be regularly spaced and act as grating{XE "grating"} lines so that the mark can be regarded as a diffraction grating with a well-known spatial period (pitch). Depending on the orientation of these grating lines, a mark may be designed to allow measurement of a position along the X axis, or along the Y axis (which is oriented substantially perpendicular to the X axis). A mark comprising bars that are arranged at +45 degrees and/or −45 degrees with respect to both the X- and Y-axes allows for a combined X- and Y-measurement using techniques as described in US2009/195768A, which is incorporated by reference.

The alignment sensor {XE "alignment sensor"} scans each mark {XE "mark"} optically with a spot of radiation to obtain a periodically varying signal, such as a sine wave. The phase of this signal is analyzed, to determine the position of the mark and, hence, of the substrate{XE "substrate"} relative to the alignment sensor, which, in turn, is fixated relative to a reference frame{XE "reference frame"} of a lithographic apparatus. So-called coarse and fine marks may be provided, related to different (coarse and fine) mark dimensions, so that the alignment sensor can distinguish between different cycles of the periodic signal, as well as the exact position (phase) within a cycle. Marks of different pitches may also be used for this purpose.

Measuring the position of the marks may also provide information on a deformation of the substrate{XE "substrate"} on which the marks are provided, for example in the form of a wafer grid{XE "wafer grid"}. Deformation of the substrate may occur by, for example, electrostatic clamping of the substrate to the substrate table and/or heating of the substrate when the substrate is exposed to radiation.

Figure 5:
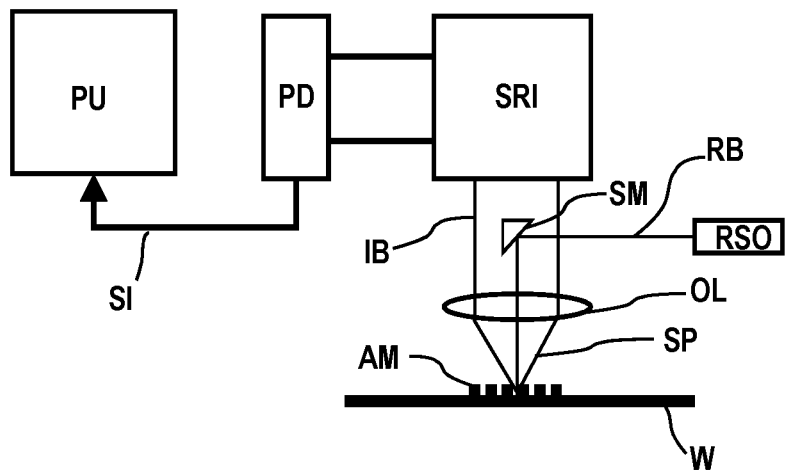
FIG. 5 depicts a schematic representation of an alignment sensor.

FIG. 5 is a schematic block diagram of an embodiment of a known alignment sensor{XE "alignment sensor"} AS, such as is described, for example, in U.S. Pat. No. 6,961,116, and which is incorporated by reference. Radiation source RSO provides a beam RB of radiation of one or more wavelengths, which is diverted by diverting optics onto a mark{XE "mark"}, such as mark AM located on substrate{XE "substrate"} W, as an illumination spot SP. In this example the diverting optics comprises a spot mirror SM and an objective lens OL. The illumination spot SP, by which the mark AM is illuminated, may be slightly smaller in diameter than the width of the mark itself.

Radiation diffracted by the mark{XE "mark"} AM is collimated (in this example via the objective lens OL) into an information-carrying beam IB. The term "diffracted" is intended to include zero-order diffraction from the mark (which may be referred to as reflection). A self-referencing interferometer SRI, e.g. of the type disclosed in U.S. Pat. No. 6,961,116 mentioned above, interferes the beam IB with itself after which the beam is received by a photodetector PD. Additional optics (not shown) may be included to provide separate beams in case more than one wavelength is created by the radiation source RSO. The photodetector may be a single element, or it may comprise a number of pixels, if desired. The photodetector may comprise a sensor array.

The diverting optics, which in this example comprises the spot mirror SM, may also serve to block zero order radiation reflected from the mark {XE "mark"}, so that the information-carrying beam IB comprises only higher order diffracted radiation from the mark AM (this is not essential to the measurement, but improves signal to noise ratios).

Intensity signals SI are supplied to a processing unit PU. By a combination of optical processing in the block SRI and computational processing in the unit PU, values for X- and Y-position on the substrate{XE "substrate"} relative to a reference frame{XE "reference frame"} are output.

A single measurement of the type illustrated only fixes the position of the mark{XE "mark"} within a certain range corresponding to one pitch of the mark. Coarser measurement techniques are used in conjunction with this to identify which period of a sine wave is the one containing the marked position. The same process at coarser and/or finer levels may be repeated at different wavelengths for increased accuracy and/or for robust detection of the mark irrespective of the materials from which the mark is made, and materials on and/or below which the mark is provided. The wavelengths may be multiplexed and de-multiplexed optically so as to be processed simultaneously, and/or they may be multiplexed by time division or frequency division.

In this example, the alignment sensor{XE "alignment sensor"} and spot SP remain stationary, while it is the substrate{XE "substrate"} W that moves. The alignment sensor can thus be mounted rigidly and accurately to a reference frame{XE "reference frame"}, while effectively scanning the mark{XE "mark"} AM in a direction opposite to the direction of movement of substrate W. The substrate W is controlled in this movement by its mounting on a substrate support and a substrate positioning system controlling the movement of the substrate support. A substrate support position sensor {XE "position sensor"} (e.g. an interferometer) measures the position of the substrate support (not shown). In an embodiment, one or more (alignment) marks are provided on the substrate support. A measurement of the position of the marks provided on the substrate support allows the position of the substrate support as determined by the position sensor to be calibrated (e.g. relative to a frame to which the alignment system is connected). A measurement of the position of the alignment marks{XE "alignment mark"} provided on the substrate allows the position of the substrate relative to the substrate support to be determined.

A lithographic apparatus LA and its related processes and methods may be highly complex, and large amounts of metrology data may be obtained in relation to the processes and/or the apparatus. As a result, many different types of metrology tools MT may be used to collect data relating to a lithographic apparatus LA, related processes, and/or products. Metrology tools, including examples described above such as scatterometers, level sensors LS, alignment sensors AS, may use radiation in order to obtain information about a metrology target. This radiation may be electromagnetic radiation.

Metrology tools MT, whether they are image-based or diffraction-based, may use one or more radiation wavelengths from a broad wavelength range within the electromagnetic spectrum. A metrology tool MT may use one or more specific wavelengths, a range of wavelengths, or a combination of the two. The range of wavelengths may be a narrowband range or a broadband range. Metrology tools MT may use objective lenses to do one or more of illuminating a target, collecting radiation diffracted and/or reflected from the target, and imaging the target. These objective lenses may have a high numerical aperture (NA) in order to increase the amount of radiation captured by the system and create maximum image resolution. A high NA objective lens designed to function over a broad wavelength range, as may be required for lithographic processes, may consist of multiple lens elements to correct for various aberrations occurring in the objective lens. The number of lenses may typically be as high as fifteen, or greater. Some of the objective lens elements may be cemented together to form doublets or triplets. Doublets, triplets and cemented lenses in general may comprise several advantages and disadvantages. An example of a disadvantage may be a mismatch in thermal expansion coefficients between the various glasses or crystals. Such a mismatch may cause mechanical stress, which in turn may cause deformations and/or stress birefringence resulting a spurious changes in the polarization of the transmitted light. An alternative to doublet, triplets or more complex lens systems may be provided by singlet lenses comprising a single lens element. Unless specifically stated otherwise, a singlet lens described herein is a single element lens which performs the main part of an imaging or other radiation control function (e.g. radiation collection). A singlet lens may be used in combination with one or more other lenses, and may still be referred to as a singlet lens when the one or more other lenses perform a separate optical function. One or more other lenses may also be separated from the singlet lens for example by being positioned far away, relative to the dimensions and properties (e.g. focal length) of the lenses. For example, a singlet lens may be combined with a second lens for aberration compensation, and/or for re-collimation. Another example may be a telescope objective singlet combined with a field lens. Doublets or triplets are commonly cemented together. However, in some instances references may be made to air-space doublets or triplets, in which the elements forming the doublet/triplets are interspaced. In such instances the combined lens elements may be referred to as a doublet or triplet as the combination of lens elements perform a shared optical function. Although doublets and triplets are discussed herein, it is understood that more than 3 lens elements may be combined (e.g. cemented together).

A first type of aberrations may be referred to as chromatic aberrations, or axial colour, which are the result of wavelength-dependent behaviour (dispersion) of the materials of the lens element(s). This may lead to a wavelength-dependent variation of the principal focal length. As chromatic aberrations are wavelength dependent, the amount of lens elements needed to address and correct aberrations may increase as the wavelength range over which the objective lens is required to function increases. A second type of aberrations that may occur in an optical system include on-axis spherical aberrations, off-axis monochromatic aberrations, coma, astigmatism, field curvature, distortion, pupil aberrations, and pupil distortion. Off-axis aberrations may have stronger effects as the distance from the axis increases. As a result, aberrations introduced may be significant for high-NA objectives. Aberrations of the second type may also be corrected for by adding additional lens elements. A third type of aberration is spherochromatic aberrations, which may comprise wavelength-dependent variations of fourth or higher order spherical aberrations. As described herein, corrections may include full corrections to remove effects of aberrations, as well as partial corrections of aberrations, in which effects of aberrations are reduced but not fully removed.

For metrology tools MT, for example for overlay metrology, the complexity and cost of an objective lens may increase with increasing spectral width of the wavelength range over which the metrology tool MT, and therefore the objective lens, must operate. The complexity of an objective lens may include the number of elements, and the shape of the elements. The complexity may also be expressed in terms of challenges and requirements regarding anti-reflection (AR) coatings for one or more of the elements. AR coatings may be required as reflected radiation within an optical system such as an objective lens may both reduce the efficiency of the optical system, and negatively affect the performance of the optical system by containing ghost reflections and/or stray radiation. Several challenges may arise regarding AR coatings for metrology tool MT with a broadband wavelength operating range, that is to say a large spectral width. A first challenge is that AR coatings are wavelength dependent, and may for example not exceed an operating range spanning more than one octave of radiation frequencies. A second challenge is that as the number of lens elements increases, the amount of surfaces that may each reflect a small portion of incident radiation and therefore require AR coatings. The requirements on AR coatings in an optical system become more stringent as the either or both of the spectral width and the amount of lens element surfaces increases, leading to more complex and more costly AR coatings.

Incorporating all of the imaging requirements of metrology tool MT places complex design specifications on the objective lenses of the metrology tool MT. It would be desirable to reduce the complexity and related cost of optical systems inside metrology tools MT. A solution proposed herein is to implement a metrology tool MT in which a multi-element objective lens is replaced by a simplified optical system. Imaging using the simplified optical system may involve using a simplified optical system to control and capture radiation to form an image. Following the optical step of the imaging process, computational post-processing of the image captured by the simplified optical system may be used to improve the image. The simplified optical system may for example be a singlet lens. A disadvantage of using a singlet lens is that it cannot correct for all monochromatic and chromatic aberrations, due to the lens only having two surfaces. However, instead of addressing these aberrations using optics as described above, computational correction steps, for example using algorithms, may provide a solution to address the aberrations.

As a result of aberrations, an image captured by a simplified optical system may be blurred. In order for computational algorithms to address this blurring, it is desirable for the aberrations to be substantially constant over the area of interest to be computationally processed. This may for example be achieved by having an area of interest that is approximately isoplanatic. The area of interest where an image is analysed based on computational processing may be located in the image plane. The area of interest may comprise the optical axis and an area surrounding it. For areas near the optical axis, having approximately constant aberrations requires the area to be free of aberrations which scale linearly with radial distance from the optical axis. The remaining aberrations scale with second, third, and higher orders of the radial distance from the optical axis, meaning they can be approximated as constant in an area near the optical axis. Therefore, providing the area of interest is sufficiently small and as a result can and near to the optical axis, aberrations other than those linearly dependent on radial distance from the optical axis may be approximated to be constant over the area of interest. An area of interest may be considered to be sufficiently small if the diameter of the area of interest is so that the field-dependent aberrations area a small fraction (e.g. between approximately ⅓ to ¼) of the diffraction-limited wavefront aberration. A uniformly filled lens may be diffraction limited if the root mean square (RMS) wavefront aberration is equal to or less than (≤) 0.072 wavelengths ($\lambda$) RMS. In an example system, the region of interest may be around 50 µm in diameter and the field dependent aberrations may be ≤0.020$\lambda$ RMS.

Provided the area of interest is sufficiently small to adhere to this approximation, constant aberrations across the area of interest can be obtained by removing first order aberrations. This may be achieved by lenses fulfilling the Abbe-sine condition, in which proportional sine-values of angles in the object and image spaces are constant:

$$\frac{\sin(\alpha_o)}{\sin(\alpha_i)} = \frac{\sin(\beta_o)}{\sin(\beta_i)} = |M|$$

Lenses exactly fulfilling the Abbe-sine condition do not possess on-axis spherical aberration, and furthermore do not possess off-axis linear coma, wherein linear coma is the primary coma aberration that scales linearly with radial distance from the optical axis. Lenses fulfilling the Abbe-sine condition may be referred to as aplanats, or aplanatic lenses. Aplanatic lenses create a small area of constant aberrations around the optical axis, and may therefore be suitable to be used in a simplified optical system so that the formed image can be computationally processed.

Aplanatic lenses consisting of a single lens may be referred to as an aplanatic singlet lens of an aplanatic singlet. An aplanatic singlet may be exactly aplanatic for only a single wavelength. Aplanatic singlets possess an inherent dispersion, causing chromatic aberrations, and spherochromatic aberrations linked to higher order wavelength dependent spherical aberrations variations. As a result, use of aplanatic singlets is known, typically for single wavelength or narrowband applications, where the effects of chromatic and/or spherochromatic aberrations may be limited, and may be negligible. However, for broadband wavelength ranges, aplanatic singlets will exhibit non-aplanatic behaviour across as least some of that broadband range. If an aplanatic singlet is to be provided for a metrology tool MT functioning over a broad spectral range (e.g. IR to DUV, or EUV), the aplanatic singlet should be designed to limit the dispersive effects.

It is to be noted that the aplanatic wavelength is the wavelength at which the primary spherical aberration and the linear field dependence of primary coma are both zero. If the lens design is known, than the aplanatic wavelength can be found by numerically calculating the primary coma and primary spherical aberration coefficients in the wavefront aberration induced by the lens as a function of field coordinate and wavelength. Such geometrical optical calculations are made by determining the optical path length of a number of rays through the lens using a geometrical-optical method known as raytracing. Such analysis is routine in commercial raytracing codes such as Zemax OpticStudio or Code V. For a lens with an unknown lens design the aplanatic wavelength must be determined by means of measurements. The simplest measurement is the measurement of the primary spherical aberration and coma as function of both wavelength and field coordinate to find the wavelength at which both the primary spherical aberration and the linear field dependence of primary coma are zero. Such measurements can be performed using e.g. a wavefront sensor known as a Shack-Hartmann sensor or in a lens testing interferometer that operates over a range of wavelengths. Analysis software is used to decompose the measured wavefront data in the primary and higher order aberration coefficients. If only discrete wavelengths can be used in the metrology the aplanatic wavelength can be determined by interpolation of the metrology data for wavelengths in between the discrete metrology wavelengths Many possible designs exist for exact aplanatic singlets for a specified aplanatic wavelength. For aplanatic singlets for a given set of lens characteristics, e.g. refractive index, principal focal length, NA, and lens thickness, chromatic aberration may be substantially identical for different aplanat designs. However, variations in spherochromatic aberration exist.

Disclosed herein is an aplanatic singlet design for which spherochromatic aberration can be minimized for a specified broadband wavelength range. This enables a design of an aplanatic singlet for a simplified optical system to be provided to a metrology tool MT for lithographic apparatus LA and related metrology. Described herein are design methods and aplanatic singlets for minimizing spherochromatic aberrations and/or balancing chromatism for a provided set of lens characteristics.

Described herein are metrology tools MT for determining a characteristic of a structure on a substrate W. The metrology tool MT comprises an optical detection system for detecting radiation over a wavelength range. The wavelength range may be a broadband range. The optical detection system may comprise an aplanatic singlet for focusing radiation onto a detector. The aplanatic singlet may have an aplanatic wavelength which is within the wavelength range.

An advantage of a metrology tool comprising an aplanatic singlet focusing radiation onto a detector is that it has a configuration simpler than where the focusing step is performed by a complex objective lens.

The aplanatic singlet is suitable for focusing radiation onto a detector, wherein the radiation may fall anywhere in the wavelength range. The aplanatic singlet may be provided in the metrology tool MT without an anti-reflection coating.

The aplanatic singlet is designed to have an aplanatic wavelength for which the nominal singlet lens design is completely aplanatic. The real lens design may deviate from the nominal design due to manufacturing tolerances. For brevity a nominal aplanatic lens design may be referred to simply as an aplanatic lens design. For other wavelengths over the wavelength range, the aplanatic singlet may approach aplanatic properties and behaviour.

The optical detection system is designed and suitable for detecting radiation over a broadband range. However, the radiation detected by the optical detections system in the metrology tool MT may comprise a plurality of wavelengths in the wavelength range of the metrology tool MT. The plurality of wavelengths may comprise a narrowband radiation range, and/or comprise a plurality of discrete wavelengths. It is also possible for the detected radiation to comprise only a single wavelength from within the wavelength range of the metrology tool MT. Radiation scattered by the substrate W may for example have a wavelength range with a bandwidth between 1 nm and 5 nm. The radiation received by the aplanatic singlet may be scattered from a substrate W. The radiation may for example be reflected or diffracted by a structure on a substrate W, wherein the metrology tool MT is for determining a characteristic of that structure on the substrate W.

Figure 6:
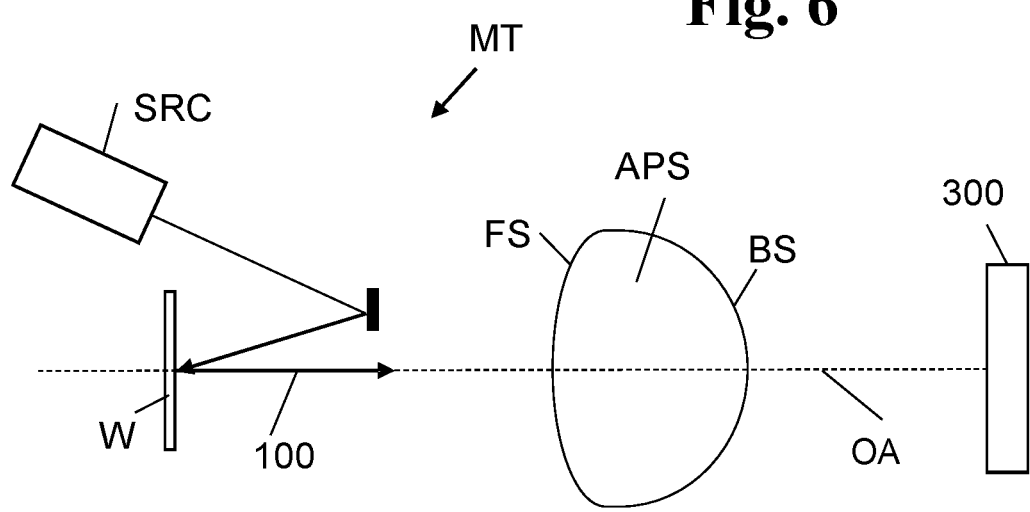
FIG. 6 depicts a schematic representation of a part of a metrology tool comprising an aplanatic singlet.

FIG. 6 depicts a part of a metrology tool MT, comprising an aplanatic singlet APS. A radiation source SRC may provide radiation to illuminate a structure on substrate W. This radiation 100 scatters, for example through reflection or diffraction, off the substrate W including the structure. The scattered radiation 100 may be captured by an aplanatic singlet APS, comprising a front surface FS and a back surface BS. The orientation of the optical setup in the metrology tool may be so that the aplanatic singlet lens is aligned with its optical axis normal to the surface of substrate W. The aplanatic singlet APS focusses the radiation 100 onto a detector 300. The optical detection system may be configured so that scattered radiation 100 propagates in the along or near the optical axis OA of the aplanatic singlet APS. Due to the aplanatic nature of the lens system, the radiation focused onto the detector may have substantially constant aberrations in an area in the vicinity of the optical axis OA for systems where the optical axis of the aplanatic singlet has a normal orientation to the surface of the substrate W. For systems in which the optical axis of the aplanatic singlet is not normal to the substrate surface W, field-dependent defocus may be introduced. The detected radiation may be provided for computational processing.

The aplanatic singlet APS may comprise a front surface FS and a back surface BS. The front surface and the back surface may both comprise on-axis radii of curvatures $r_f$ and $r_b$ respectively, which may also be referred to as on-axis curvatures, for brevity. The on-axis curvatures of the aplanatic singlet are such that the spherochromatic aberration of the aplanatic singlet is within 20% of a minimum spherochromatic aberration. The aplanatic singlet APS further comprises a plurality of lens characteristics other than the on-axis curvatures $r_f$ and $r_b$. The minimum spherochromatic aberration is determined as the minimum spherochromatic aberration that can be obtained for all aplanatic singlets APS having the same set of other characteristics.

An advantage of designing an aplanatic singlet to have spherochromatic aberration within 20% of the minimum spherochromatic value is that it may improve the performance of the aplanatic singlet APS in the metrology tool MT. Such an aplanatic singlet design may reduce or even minimise the spherochromatic aberrations in an area of interest for correction by numerical post-processing of resulting blurred images, as described above. Important aspects of the invention described herein, are the realisation by the inventor that a minimum spherochromatic value exists for an aplanatic singlet, and the subsequent determination of designs to approach that minimum. Determination of the spherochromatic minimum for an aplanatic singlet with a specific set of characteristics will be discussed in more detail below.

In general, the design and shape of a lens is chosen so that the asphere slope angle is minimised. Such a design may be chosen for aspheric surface manufacturing ease, and for AR coating uniformity. Design requirements for minimising asphere slope angles may be incompatible with designing the on-axis curvatures so that the spherochromatic aberrations fall within a specific range from a spherochromatic minimum value. The design choice to have the spherochromatic aberrations fall within a 20% range of a spherochromatic minimum is not an obvious choice based on known design practice. In alternative design choices, the spherochromatic may fall within an 18%, 16, 14%, 12%, 10%, 8%, or 6% range of a spherochromatic minimum.

Figure 7:
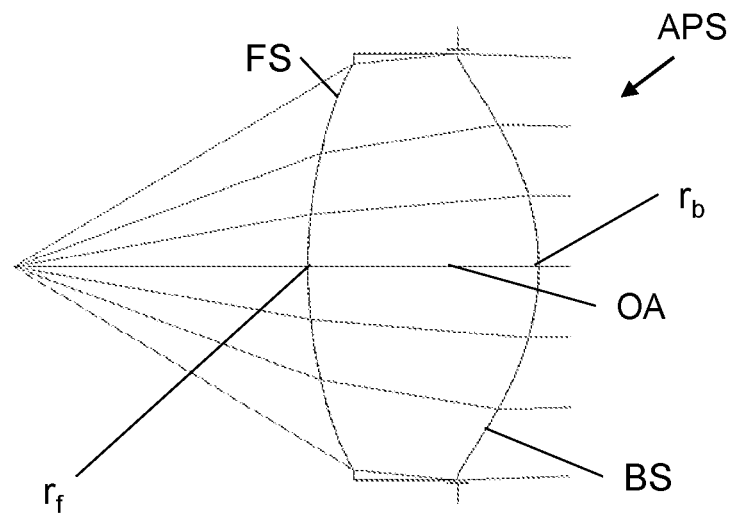
FIG. 7 depicts an aplanatic singlet for a metrology tool.

FIG. 7 depicts an aplanatic singlet APS having a front surface FS, and a back surface BS. At the intersection of the optical axis and the front surface FS of the aplanatic singlet APS, the front on-axis radius of curvature $r_f$ is indicated. Similarly, at the intersection of the back surface BS and the optical axis OA of the aplanatic singlet APS, the back surface on-axis radius of curvature $r_b$ is indicated. In FIG. 7, the back surface BS has a shorter radius of curvature than the front surface FS.

The aplanatic singlet APS may be designed and configured in a metrology tool MT so that, for normal operation of the metrology tool MT, the front surface FS receives the radiation 100 first. The radiation 100 is then propagated through the aplanatic singlet APS, before reaching the back surface BS of the aplanatic singlet APS. After passing through the back surface BS of the aplanatic singlet APS, radiation 100 may be focused onto a detector 300.

The aplanatic singlet APS may be bi-aspheric, that is to say, the front surface FS and the back surface BS may have an aspheric curvature. However, a bi-aspheric aplanatic singlet APS in this instance may also include those aplanatic singlet APS designs in which one or both of the front FS and back BS surfaces have a spherical curvature.

In order to design the aplanatic singlet lens, it may be necessary to define and fix a number of characteristics of the lens such that the on-axis curvature which provides a minimum spherochromatic aberration can be determined. Such characteristics may also be related to and determined by requirements of the metrological tool and/or optical detection system. The plurality of other lens characteristics may comprise two or more of a material, a thickness, a numerical aperture NA, a focal length, which may be a principal focal length, and a magnification.

The material may determine the refractive index, and the related dispersive properties of the aplanatic singlet. The thickness is understood to include at least the thickness of the lens at the optical axis. Based on an on-axis thickness and an understanding of the curvatures of both lens surfaces, the thickness of the singlet at positions away from the axis may be determined. The principal thickness is understood to be the distance from the back surface of the aplanatic singlet to the focal point. Other focal lengths from which the properties of the singlet may be unambiguously determined, may be provided additionally, or alternatively (e.g. from the middle of the lens along the optical axis, from the front surface along the optical axis, etc.).

The combination of refractive index, thickness, principal focal length, magnification, NA, and the requirement of an aplanatic wavelength for which the aplanatic singlet possesses aplanatism, may provide sufficient detail to describe the shapes of the front and back surfaces of the aplanatic singlet.

The on-axis curvatures of the front surface and the back surface may be expressed as a Coddington shape factor, also referred to as a Coddington shape parameter. A Coddington shape factor B may be expressed in terms of the reciprocals $c_f$ and $c_b$ on-axis curvatures of the front surface on axis radii $r_f$ and the back surface $r_b$:

$$B = \frac{c_f + c_b}{c_f - c_b}$$

Although a specific definition of a Coddinton shape factor B is provided above, variations on this shape factor can also be used. Variations of a Codington shape factor may include performing mathematic operations on the whole or parts of the factor and/or adding factors or terms to the shape factor. Alternatively to a Coddington shape factor, other shape factors may be used, provided that they express the on-axis curvatures of the aplanatic singlet.

The spherochromatic aberration may be a spherochromatic wavefront aberration. Spherochromatic aberration values may be expressed as root mean square (RMS) values of spherochromatic aberration. Spherochromatic aberration may be wavelength dependent. For a specific selection of front surface FS and back surface BS curvatures $r_f$ and $r_b$, spherochromatic aberration may be expressed using a single value, for the entire wavelength range of the aplanatic singlet APS. This may achieved by determining the highest spherochromatic aberration value, in absolute terms, across the wavelength range, and selecting this value to represent the spherochromatic aberration of the aplanatic singlet APS for the corresponding on-axis curvatures and other lens characteristics.

Due to dispersion in the material making up the aplanatic singlet APS, the principal focal length of the aplanatic singlet APS may be wavelength-dependent. This wavelength dependency of the focal length may be referred to as axial colour, or primary chromatic aberration. When determining the spherochromatic aberration for different wavelengths, the measurements may be corrected for axial colour, for example by moving the object, singlet, and/or sensor, so that the spherochromatic aberration can be determined for an in-focus image.

As mentioned above, an aplanatic singlet can only be exactly aplanatic for a single wavelength, referred to herein as the aplanatic wavelength of the aplanatic singlet APS. For the remaining wavelengths in the wavelength range for which the aplanatic singlet APS is configured to be used in the metrology tool MT, the properties of the aplanatic singlet APS diverge from aplanatism. The aplanatic wavelength can be chosen as part of the design, that is to say, given a set of other lens characteristics, the aplanatic wavelength can be set by designing the curvatures of the aplanatic singlet APS accordingly. Therefore, the choice of the aplanatic wavelength may be used to affect the properties of the remaining wavelengths. As it may be desirable to have properties as close as possible to aplanatic behaviour across the entire wavelength range, the aplanatic wavelength can be set to achieve this.

The aplanatic wavelength of the aplanatic singlet APS may be chosen from the broadband wavelength range of the metrology tool MT. The choice of aplanatic wavelength may be chosen to balance spherochromatic aberration values across the broadband wavelength range on either side of the aplanatic wavelength. The aplanatic wavelength may be provided at a point at which the highest spherochromatic aberration for wavelengths shorter than the aplanatic wavelength in the broadband wavelength range falls within a predetermined range of the highest spherochromatic aberration for wavelengths longer than the design wavelength in the broadband wavelength range.

Figure 8:
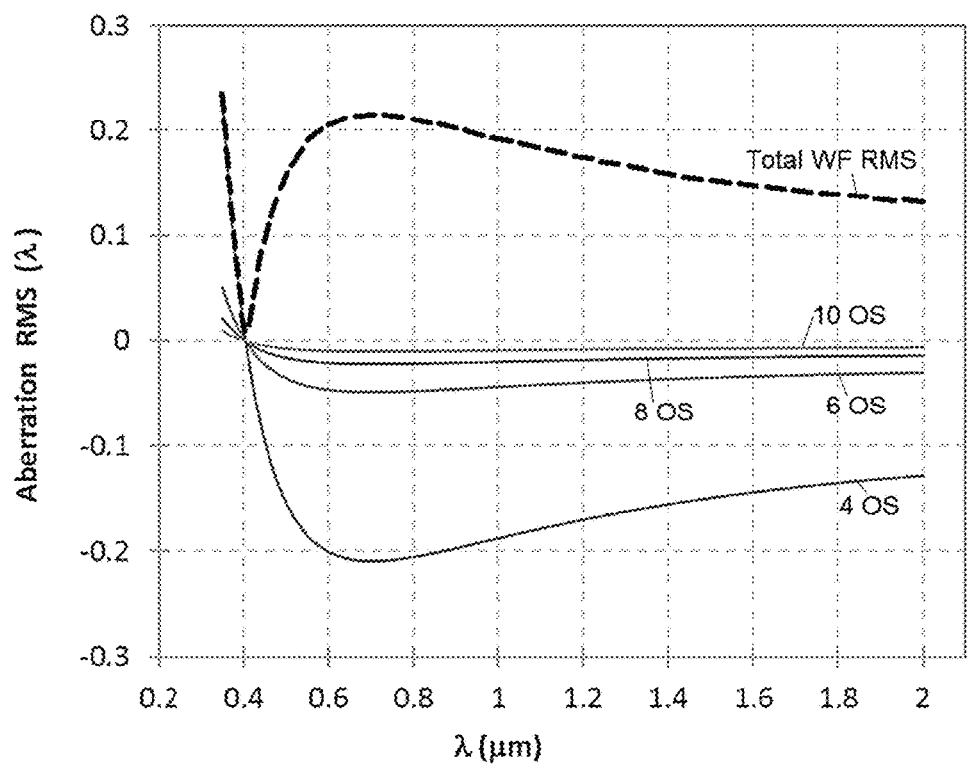
FIG. 8 depicts a graph showing $4^{th}$ and higher order spherical aberrations balanced around an aplanatic wavelength of an aplanatic singlet.

FIG. 8 depicts a graph illustrating $4^{th}$ and higher order spherochromatic aberrations, as well as a total wavefront root mean square value for an aplanatic singlet across a broadband wavelength range. The wavelength range for which aberration values are provided spans from 350 nm to 2000 nm, represented on the horizontal axis of the graph. On the vertical axis, the aberrations are represented, in units of wavelength λ. The 4 solid lines in the graph represent $4^{th}$ order 4OS, $6^{th}$ order 6 OS, $8^{th}$ order 8 OS, and $10^{th}$ order 10 OS spherochromatic aberration coefficients, using a Zernike fringe definition. The total RMS wavefront aberration is indicated with a dashed line; as the aberration is expressed as a root mean square, all values are positive.

In the graph, the aplanatic wavelength is chosen to be 405 nm. For the 350 nm-2000 nm wavelength range, this results in a balance of RMS aberration values for wavelengths shorter than the 405 nm, and wavelengths longer than 405 nm. Due to the shape of the total wavefront RMS, specifically the contribution of the 4OS spherochromatic aberration, aberration contributions rise steeply for wavelengths just below the aplanatic wavelength. In order to avoid high aberration values for wavelengths on the shorter end of the wavelength range, the aplanatic wavelength is chosen nearer to the shorter end of the wavelength range.

The highest spherochromatic aberration for both the wavelengths shorter than the aplanatic wavelengths and the wavelengths longer than the aplanatic wavelength may have an RMS value between 0.05 wavelengths and 26 wavelengths. Low highest spherochromatic aberration values may occur for small lenses with a low numerical aperture, for example a $CaF_2$ lens (low dispersion) with NA=0.5, and f=2 mm. High values for the highest spherochromatic aberration of around 26 wavelengths may occur for higher dispersion lenses with a larger size and NA, for example NA=0.9 and f=20 mm.

Specifically, in FIG. 8, the aplanatic wavelength is chosen so that the total spherochromatic wavefront RMS value at the shortest wavelength (350 nm) is similar to, that is to say falls within a predetermined range from, the value of the total spherochromatic wavefront RMS around 700 nm, where the graph reaches a local maximum. If the design wavelength would have been chosen to be shorter than 405 nm, the maximum RMS in the shorter wavelength band would decrease, and the maximum RMS for the longer wavelengths would increase. Similarly, if the aplanatic wavelength were chosen to be longer than 405 nm, the maximum RMS for the shorter wavelengths would increase, while the maximum RMS for the longer wavelengths would decrease. The design wavelength can be chosen so that the two maximum values fall within a predetermined range from each other. In an example, the predetermined range may be set to be 0.02 wavelengths for RMS values. That is to say, the maximum RMS aberration values for the wavelengths shorter and longer than the aplanatic wavelength may have a maximum difference of 0.02 wavelengths RMS. In some instances a predetermined larger than 0.02λ, RMS may be chosen, for example in case a wavelength corresponding to a particular radiation source is used, e.g for lens quality validation using interferometry. Generally, a predetermined range may be chosen to be a small fraction (e.g. 1%, 2%, or 5%) of the spherochromatic maximum. For example, in a case of a 26 wavelengths spherochromatic maximum, a maximum predetermined range may fall between 1 to 5% of 26 wavelengths.

The predetermined range may be determined based on a design choice. Alternatively or additionally, the predetermined range may be determined by limitations on the optical detection system, for example, fabrication of the lens surface curvatures to match theoretically calculated curvatures.

In FIG. 8 the maximum RMS values for wavelengths shorter than, and wavelengths longer than the aplanatic wavelength are not exactly equal. This may for example be because of convenient wavelengths that may be chosen in the vicinity of the aplanatic wavelength for which a balance between maxima would be obtained. A wavelength may be convenient because there is a straightforward illumination source available to provide radiation at that exact wavelength. Alternatively or additionally, there may wavelengths of particular interest to metrology, for example due to resonances. It may be beneficial to choose a convenient wavelength of particular interest, so that the exact aplanatic properties of the lens at the aplanatic wavelength can be exploited.

When comparing spherical aberration values, determination of higher and lower values are made in absolute terms, that is to say, based on the magnitude of the value, and not taking into account the + or − sign of the aberrations, e.g. positive/negative signs are not take into account for value comparisons. This may for example be achieved by using RMS values.

As described above, an aplanatic singlet may be designed to have a spherochromatic aberration within 20% from a minimum spherochromatic aberration, also referred to as a spherochromatic minimum. A spherochromatic minimum may be determined for each specified plurality of other characteristics and aplanatic wavelength. For a given set of characteristics of a lens, for example the plurality of other characteristics (magnification, focal length, numerical aperture, on-axis thickness, and material/refractive index) and an aplanatic wavelength, the on-axis curvatures may be designed and set to approach this minimum. It will be appreciated that the focal length may be the principal focal length.

Figure 9:
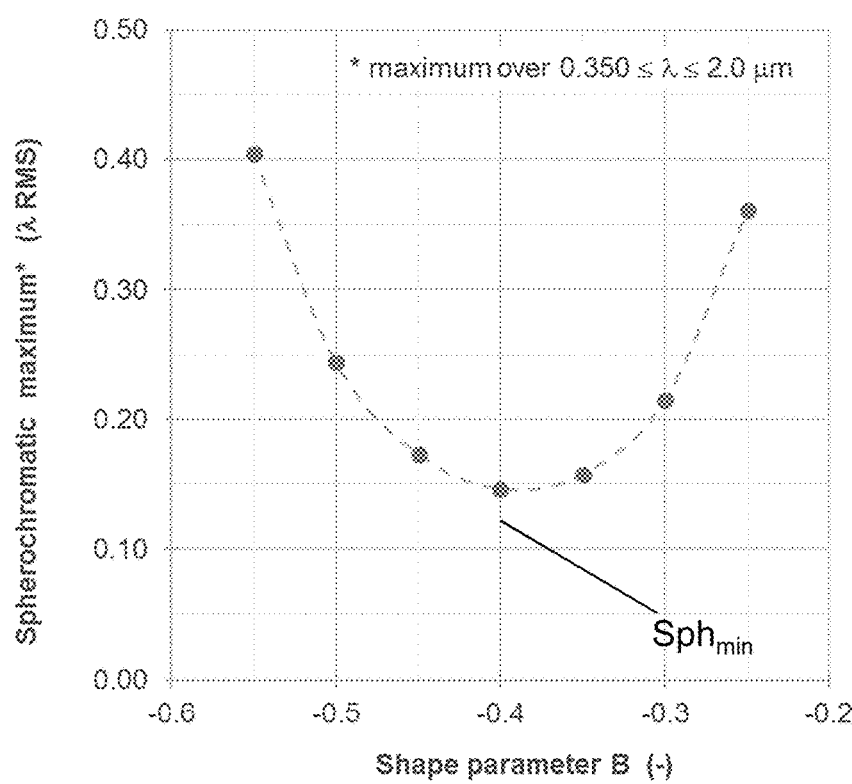
FIG. 9 depicts a graph showing spherochromatic aberration as a function of shape factor for aplanatic singlets with different curvatures.

The on-axis curvatures of an aplanatic singlet can be expressed with a shape factor, also referred to as a shape parameter, for example a Coddington factor. A Coddinton shape factor may be used to express two on-axis curvatures of the front FS and back BS surfaces $r_f$ and $r_b$ in a single numerical value. The inventor realised that it can be shown, for example using a thin lens approximation or using metrology data for different aplanatic singlets having different shape factors that the relation between a Coddington shape factor B (or a variation on the Coddington shape factor) and the maximum spherochromatic aberration over a wavelength range is approximately quadratic. This is illustrated in FIG. 9, where the spherochromatic aberration is shown as a function of Coddington shape factor. The resulting graph is essentially quadratic in shape. The measurement points correspond to 7 aplanatic singlets with 7 different Coddington shape factors B between −0.55 and −0.25. The different aplanatic singlets all possessed the same set of other parameters: material CaF2 with refractive index n=1.442 at an aplanatic wavelength of 405 nm, magnification M=−15, principal focal length f=5 mm, on-axis thickness d=3 mm, and numerical aperture NA=0.5. In FIG. 9, the spherochromatic minimum corresponds to a shape factor with a value around B=−0.4. The spherochromatic aberration is referred to as a spherochromatic maximum as it is the maximum spherochromatic value over a wavelength range. In FIG. 9 the wavelength range is 350 nm to 2000 nm, and the maximum spherochromatic aberration occurs around a wavelength of 700 nm (see FIG. 8).

FIG. 9 shows RMS aberration values, which are always positive, meaning the parabolic shape possesses an absolute minimum. However, even in cases where negative aberration values are included, the magnitude of the aberration may be considered, so that there is always a value of the shape factor for which the spherochromatic aberration possesses a minimum value. This minimum (extremum) of the quadratic shape represents the spherochromatic minimum $Sph_{min}$.

Once the spherochromatic minimum is determined, an aplanatic singlet APS can be designed to have a shape factor approaching the shape factor corresponding to the spherochromatic minimum $Sph_{min}$. However, due to fabrication tolerances, and measurement errors, it may not always be possible to produce an aplanatic singlet exactly meeting the shape factor corresponding to the minimum spherochromatic aberration. Therefore design requirements may set the spherochromatic aberration of an aplanatic singlet to fall within a specified range of the spherochromatic minimum $Sph_{min}$, for example 20%. In a more stringent design requirement, the spherochromatic aberration may need to fall for example within 6% of the spherochromatic minimum.

As mentioned above, the determination of a spherochromatic minimum $Sph_{min}$ may be done in relation to a specific set of characteristics for an aplanatic singlet, by keeping these characteristics the same, and by varying the on-axis curvatures $r_f$ and $r_b$ of the front surface FS and back surface BS.

The material from which the aplanatic singlet is constructed may be a low-dispersion material, an extra-low dispersion material, ultra-low dispersion material, or extremely-low dispersion material. A low dispersion material may be a material with an Abbe number greater than 63. In some implementations, the material of the aplanatic singlet may have an Abbe number greater than 70. In some implementations, the material of the aplanatic singlet may have an Abbe number greater than 90. The material may be a phosphate glass or a fluorophosphate glass. The material may for example be one of $CaF_2$, $BaF_2$, LiF, $BaLiF_3$, $SrF_2$, $Lu_3Al_5O_{12}$, or $Y_3Al_5O_{12}$.

The numerical aperture of the aplanatic singlet may be in a range of 0.2 to 0.95. For example, the numerical aperture may have a value of 0.5. In materials with a lower refractive index, the NA will have a lower maximum possible value. For example, for $CaF_2$ glass, the maximum NA of the aplanatic singlet may not exceed around 0.6. In materials with a higher refractive index, the maximum value for the NA may be higher.

The magnification of an aplanatic singlet may have a magnitude in the range of −10 to −100. The magnification may for example have a value of −15.

The on-axis thickness of the aplanatic singlet may have a value between 1 mm and 10 mm, for example 3 mm. For thicknesses below 1 mm, the free working distance of the lens may be too small for dark field illumination. Thick lenses, e.g. lenses with a thickness above 10 mm, may lead to higher spherochromatic aberration values, depending on the principal focal length.

The principal focal length may have a value between 1 mm and 20 mm, for example 5 mm.

The aplanatic singlet may be configured to form a part of a metrology tool MT. The aplanatic singlet may be configured to operate over a wavelength range. The wavelength range may be determined by the metrology tool functionality. The wavelength range over which the aplanatic singlet is configured to operate may comprise wavelengths from deep ultraviolet radiation to infrared radiation. The wavelength range may be comprised within the spectral range of 200 nm to 2000 nm. The wavelength range may for example comprise 350 nm to 2000 nm.

The aplanatic singlet may be configured to operate in the metrology tool MT, in use, without an anti-reflection coating. The aplanatic singlet may be an objective lens for the metrology tool MT. The aplanatic singlet may also be provided comprising any of the properties described above and/or used by itself, separate from a metrology tool MT or other apparatus.

The metrology tool MT may be a wafer inspection tool, specifically a multi-wavelength wafer inspection tool. The metrology tool MT may be used to measure overlay using a plurality of wavelengths. The metrology tool MT may be used to measure any characteristic related to a lithographic process. The metrology tool MT may be include as part of a lithographic apparatus LA.

The characteristics of an aplanatic singlet as described herein may be determined using a design method. A design method may start by setting, or otherwise obtaining, a plurality of lens characteristics. These may be the other lens characteristics described above: material, principal focal length, on-axis thickness, magnification, and numerical aperture, or others. The method may then comprise setting an aplanatic wavelength for the aplanatic singlet, wherein the aplanatic wavelength falls within the wavelength range. The method may comprise selecting on-axis curvatures for the aplanatic singlet, based on the plurality of other lens characteristics and the aplanatic wavelength. Following this step, spherochromatic aberrations may be determined for the aplanatic singlet, based on the on-axis curvatures, the aplanatic wavelength, and the plurality of other lens characteristics. The spherochromatic aberrations may be compared to the spherochromatic minimum for an aplanatic singlet with the selected properties (other than the on-axis curvatures). If the spherochromatic aberrations fall outside a 20% range around the spherochromatic minimum, a different set of on-axis curvatures may be selected, and the determination and comparison of spherochromatic aberrations may be repeated for the different design. This iterative method may be repeated until a suitable set of on-axis curvatures is found, for which the spherochromatic aberrations approach the spherochromatic minimum.

Determining spherochromatic aberrations may comprise determining spherochromatic aberrations across the wavelength range of the aplanatic singlet. The method may involve determining whether the spherochromatic aberrations are balanced across the wavelength range. If the spherochromatic aberrations are not balanced, a different aplanatic wavelength may be set, and the subsequent steps in the method may be repeated. Being balanced across a wavelength range may be defined by the maximum spherochromatic aberration value on either side of the aplanatic wavelength in the wavelength range falls within a predetermined range of each other. This predetermined range may for example be 0.02 wavelength RMS, as described in more detail above.

Figure 10:
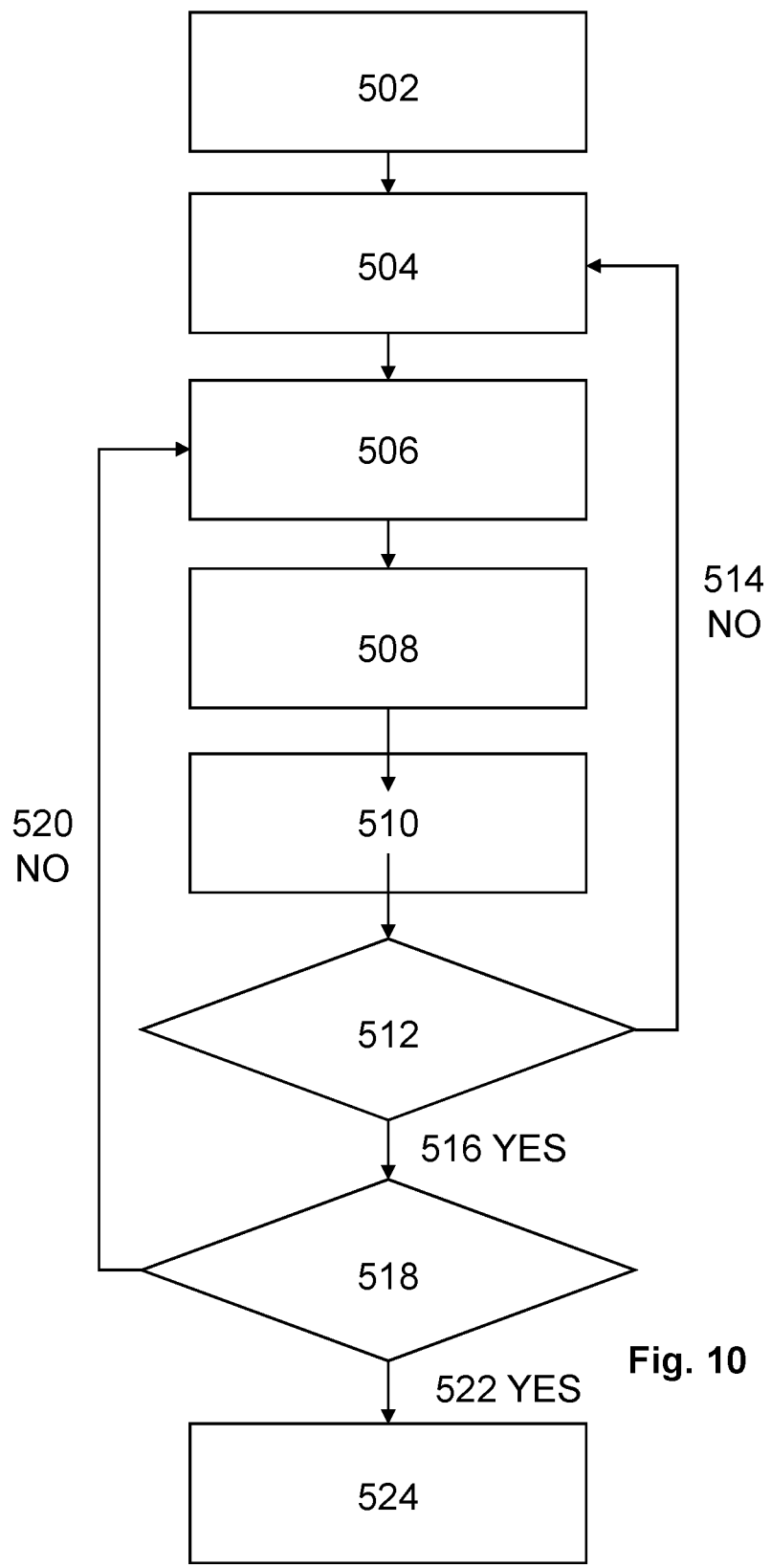
FIG. 10 depicts a flow diagram of steps in a method for determining lens design parameters.

FIG. 10 depicts a flow diagram of the steps in designing and determining design parameters for a lens such as an aplanatic singlet APS described herein. In step 502 the lens characteristics may be chosen. The choices of lens parameters may be partially or wholly determined by requirements for the use of the aplanatic singlet APS, for example the wavelength range over which the lens should function, required magnification and NA, space availability, compatibility and/or availability of materials, etc. The characteristics to be determined in step 502 may include lens material, on-axis thickness d, focal length f, magnification M, and numerical aperture. In step 504 an aplanatic wavelength may be set. Choosing an aplanatic wavelength may involve considering the balancing of spherochromatic aberrations, as described in more detail above. The process may also involve determining the refractive index n for the material of the aplanatic singlet at the aplanatic wavelength.

In step 506 a shape factor B may be chosen, for example a Coddington shape factor.

The choice of shape factor B may be based on an approximated calculation of a shape factor, for example based on a thin lens approximation, which is set out in more detail below. In step 508, on-axis curvatures $r_f$ and $r_b$ of the aplanatic singlet may be determined. This determination may be based on the shape factor B, the refractive index n, focal length f, and on-axis thickness d. The values of these parameters may be input to the lensmaker's equation, and an equation linking the shape factor to the on-axis curvatures. Further calculations may be performed based on the determined curvatures and the aplanatic singlet characteristics. These calculations may for example include a determination of the principal planes, object and image distances to the on-axis surfaces of the aplanatic singlet, and aspheric shapes of the front FS and back BS surfaces of the aplanatic singlet. Calculations of the aspheric shape of the front FS and back BS surfaces of the aplanatic singlet may be based on the Wasserman-Wolf method, as described in G. D. Wasserman, E. Wolf, "On the theory of Aplanatic Aspheric Systems", Proc. Phys. Soc. B, 62, 2, pp. 2-8 (1949).

In step 510, the spherochromatic aberration of the aplanatic singlet having the selected and determined properties, may be determined. The spherochromatic aberrations may be determined across the wavelength range. In step 512, the method may involve checking whether the spherochromatic aberrations are balanced across the wavelength range. Checking whether the spherochromatic aberrations are balanced may comprise whether the highest spherochromatic aberration values on either side of the aplanatic wavelength fall within a predetermined wavelength range. If the wavelengths are not balanced 514, the method returns to step 504, where a different aplanatic wavelength may be chosen. If the spherochromatic aberrations are balanced 516, the aplanatic wavelength may be kept the same.

In step 518, the method may check whether the maximum spherochromatic aberration value of the aplanatic singlet across the wavelength range falls within a predetermined range of a spherochromatic minimum for the set of chosen and determined properties. If not 520, the method may return to step 506, and selects a different shape factor. If the maximum spherochromatic aberration falls within the predetermined range 522, the design parameter values for the aplanatic singlet design may have been found 524, and the design process may be finalised.

For a thin lens, the existence of a spherochromatic minimum may be approximately derived analytically. Starting from the lensmaker's equation:

$$\frac{1}{f} = (n-1)\left(c_1 - c_2 + \frac{n-1}{n}dc_1c_2\right)$$

in which f is the principal focal length, n is the refractive index, d the on-axis lens thickness and $c_1$ and $c_2$ are the reciprocals of the (on-axis) radii of curvature of the front and back lens surfaces, respectively. For a thin lens, the lensmaker's formula may be reduced by approximating d=0, to:

$$\frac{1}{f} = (n-1)(c_1 - c_2)$$

A Coddington shape factor B and conjugate parameter C may be introduced as:

$$B = \frac{c_1 + c_2}{c_1 - c_2} \text{ and } C = \frac{M+1}{M-1}$$

Wherein M is the magnification

For a numerical aperture NA with a small value, the Seidel spherical aberration sum may be provided as:

$$S_I = \frac{NA^4 f}{4}\left\{\left(\frac{n}{n-1}\right)^2 + \frac{n+2}{n(n-1)^2}\left(B + \frac{2(n^2-1)}{n+2}C\right)^2 - \frac{n}{n+2}C^2\right\}$$

Wherein $S_I$ is a Seidel sum of aberrations.

Spherochromatic aberration is spherical aberration caused by a change in refractive index from the refractive index for the aplanatic wavelength due to dispersion. As a result, a partial derivative of the Seidel sum to the refractive index may be an indication of the spherochromatic aberration:

$$\frac{\partial S_I}{\partial n} = -\frac{NA^4 f}{2}\left\{\frac{B^2(n^2+3n-1) + 2BC(n^3+n^2-3n+1) + C^2(n-1)^3 + n^3}{n^2(n-1)^3}\right\}$$

It can be seen that this partial derivative is quadratic in the Coddington shape factor B. To determine a minimum of the spherochromatic aberrations, a derivative to B can be determined:

$$\frac{\partial}{\partial B}\frac{\partial S_I}{\partial n} = 0$$

This derivative can be solved from:

$$\frac{\partial}{\partial B}\frac{\partial S_I}{\partial n} = -NA^4 f\left\{\frac{B(n^2+3n-1) + C((n^3+n^2-3n)+1)}{n^2(n-1)^3}\right\} = 0$$

Which results in a solution of:

$$B = -\frac{C((n^3+n^2-3n)+1)}{n^2+3n-1}$$

This solution represents a value of shape factor B for which a thin lens has minimum spherochromatic aberration. Filling in M=−15 and n=1.44 (CaF2) we find B=−0.282. This described a thin lens, with biconvex surfaces wherein the radius of curvature of the front surface is slightly larger, in absolute terms, than the radius of curvature of the back surface. This value of B may be used as a guide for determining a value of B to minimize spherochromatic aberrations for a real, non-thin aplanatic singlet. However, due to approximations in the calculations, the potentially aspherical nature of the aplanatic singlet, and the non-zero thickness of the aplanatic singlet, the value of B is merely an approximation of the shape factor minimizing the spherochromatic aberrations for an aplanatic singlet.

Further embodiments are disclosed in the subsequent numbered clauses:

1. A metrology tool for determining a characteristic of a structure on a substrate, comprising:

an optical detection system for detecting radiation over a wavelength range, wherein the optical detection system comprises an aplanatic singlet lens for focusing the radiation on to a detector, wherein the aplanatic singlet lens has an aplanatic wavelength which is within the wavelength range.

2. A metrology tool according to clause 1, wherein the aplanatic singlet lens comprises:

a front surface and a back surface having on-axis curvatures at which a spherochromatic aberration of the aplanatic singlet lens is within 20% of a minimum spherochromatic aberration; and a plurality of other lens characteristics;

wherein the minimum spherochromatic aberration is the minimum spherochromatic aberration for all aplanatic singlet lenses having the same other lens characteristics.

3. A metrology tool according to clause 2, wherein the plurality of other lens characteristics comprise at least two of: a material, a thickness, a numerical aperture, a focal length, and a magnification.

4. A metrology tool according to any of clauses 2 to 3, wherein the on-axis curvatures are expressed as a Coddington shape factor.

5. A metrology tool according to any of clauses 2 to 4, wherein the spherochromatic aberration is a wavefront aberration and comprises spherochromatic aberration root mean square (RMS) values.

6. A metrology tool according to any of clauses 2 to 5, wherein the spherochromatic aberration of the aplanatic singlet lens is wavelength dependent, and wherein the spherochromatic aberration with the highest value across the wavelength range is taken to represent the spherochromatic aberration of the aplanatic singlet lens.

7. A metrology tool according to any of the preceding clauses, wherein the aplanatic singlet lens is configured to be aplanatic for an aplanatic wavelength in relation to the wavelength range; and wherein the aplanatic wavelength is provided at a point at which the highest spherochromatic aberration for wavelengths shorter than the aplanatic wavelength in the broadband wavelength range falls within a predetermined range of the highest spherochromatic aberration for wavelengths longer than the aplanatic wavelength in the broadband wavelength range.

8. A metrology tool according to clause 7 when dependent on clause 5, wherein the highest spherochromatic aberration has an RMS value between 0.05 wavelengths and 26 wavelengths.

9. A metrology tool according to any of clauses 7 or 8, wherein the predetermined range is 0.02 wavelengths RMS.

10. A metrology tool according to any preceding clause, wherein the radiation comprises a plurality of wavelengths in broadband wavelength range which the detector is configured to detect.

11. A metrology tool according to any of the preceding clauses, wherein the radiation comprises a wavelength range with a bandwidth between 1 nm and 5 nm.

12. A metrology tool according to any of the preceding clauses, wherein the aplanatic singlet lens is bi-aspheric.

13. A metrology tool according to any of clauses 3 to 12 when dependent of clause 3, wherein the material is a low-dispersion material with an Abbe number greater than 63.

14. A metrology tool according to clause 13, wherein the low dispersion material has an Abbe number greater than 90.

15. A metrology tool according to clause 13, wherein the material is one of $CaF_2$, $BaF_2$, LiF, $BaLiF_3$, $SrF_2$, $Lu_3Al_5O_{12}$, or $Y_3Al_5O_{12}$.

16. A metrology tool according to any of clauses 3 to 15 when dependent of clause 3, wherein the numerical aperture is less than 0.95, greater than 0.2, and optionally is 0.5.

17. A metrology tool according to any of clauses 3 to 16 when dependent of clause 3, wherein the magnification has a magnitude from 10 to 100.

18. A metrology tool according to any of clauses 3 to 17 when dependent of clause 3, wherein the thickness has a value between 1 mm and 10 mm.

19. A metrology tool according to any of clauses 3 to 18 when dependent of clause 3, wherein the principal focal length has a value between 1 mm and 20 mm.

20. A metrology tool according to any of the preceding clauses, wherein the broadband wavelength range comprises wavelengths from deep ultraviolet radiation to infrared radiation.

21. A metrology tool according to any of the preceding clauses, wherein the broadband wavelength range comprises a range from 200 nm to 2000 nm.

22. A metrology tool according to any of the preceding clauses, wherein the aplanatic singlet lens does not comprise an anti-reflective coating in use.

23. A metrology tool according to any of the preceding clauses, wherein the aplanatic singlet lens is an objective lens.

24. A metrology tool according to any of the preceding clauses, wherein the characteristic to be determined is overlay.

25. A metrology tool according to any of the preceding clauses, wherein the metrology tool is a multi-wavelength metrology sensor.

26. An aplanatic singlet lens for receiving radiation over a wavelength range; wherein the aplanatic singlet lens is configured to be aplanatic for an aplanatic wavelength; wherein the aplanatic singlet lens comprises:

a front surface and a back surface having on-axis curvatures at which a spherochromatic aberration of the aplanatic singlet lens is within 20% of a minimum spherochromatic aberration; and a plurality of other lens characteristics;

and wherein the minimum spherochromatic aberration is the minimum spherochromatic aberration for all aplanatic singlet lenses having the same other lens characteristics.

27. An aplanatic singlet lens according to clause 26, wherein the aplanatic wavelength is provided at a point at which the highest spherochromatic aberration for wavelengths shorter than the aplanatic wavelength in the broadband wavelength range falls within a predetermined range of the highest spherochromatic aberration for wavelengths longer than the aplanatic wavelength in the broadband wavelength range.

28. An aplanatic singlet lens according to any of clauses 26 or 27, wherein the predetermined range is 0.02 wavelengths RMS.

29. An aplanatic singlet lens according to any of clauses 26 to 28, wherein the highest spherochromatic aberration has an RMS value between 0.05 wavelengths and 26 wavelengths.

30. A lithographic apparatus comprising a metrology tool according to any of clauses 1 to 25.

31. A method of designing an aplanatic singlet lens configured for use across a wavelength range, the method comprising:

a) setting a plurality of lens characteristics;

b) setting an aplanatic wavelength, wherein the aplanatic wavelength falls within the wavelength range;

c) selecting, based on the plurality of lens characteristics and the aplanatic wavelength, on-axis curvatures for the aplanatic singlet lens;

d) determining, based on the on-axis curvatures, the aplanatic wavelength, and the plurality of other lens characteristics, spherochromatic aberrations for the aplanatic singlet lens;

e) comparing the spherochromatic aberrations to a predetermined minimum spherochromatic value; and wherein, if the spherochromatic aberration falls outside a 20% range of the predetermined minimum spherochromatic value, selecting different on-axis curvatures in step c and repeating steps d and e.

32. A method according to clause 31, wherein determining the spherochromatic aberrations comprises determining spherochromatic aberrations across the wavelength range;

and wherein the method further comprises:

determining whether the spherochromatic aberrations are balanced across the wavelength range; and setting a different aplanatic wavelength if the spherochromatic aberrations are not balanced across the wavelength range.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

Although specific reference is made to "metrology apparatus/tool/system" or "inspection apparatus/tool/system", these terms may refer to the same or similar types of tools, apparatuses or systems. E.g. the inspection or metrology apparatus that comprises an embodiment of the invention may be used to determine characteristics of structures on a substrate or on a wafer. E.g. the inspection apparatus or metrology apparatus that comprises an embodiment of the invention may be used to detect defects of a substrate or defects of structures on a substrate or on a wafer. In such an embodiment, a characteristic of interest of the structure on the substrate may relate to defects in the structure, the absence of a specific part of the structure, or the presence of an unwanted structure on the substrate or on the wafer.

The invention claimed is:

1. A metrology tool for determining a characteristic of a structure on a substrate, comprising:
   an illumination source configured to direct a radiation beam at the structure; and
   an optical detection system configured to detect radiation after interaction with the structure over a wavelength range, wherein the optical detection system comprises an aplanatic singlet lens configured to focus the radiation on to a detector, wherein the aplanatic singlet lens has:
   an aplanatic wavelength that is within the wavelength range;
   a front surface and a back surface having on-axis curvatures at which a spherochromatic aberration of the aplanatic singlet lens is within 20% of a minimum spherochromatic aberration; and
   a plurality of other lens characteristics comprising two or more of a material, a thickness, a numerical aperture, a focal length, and a magnification; and
   wherein the minimum spherochromatic aberration is the minimum spherochromatic aberration for the aplanatic singlet lenses having the same other of the plurality of lens characteristics.

2. The metrology tool of claim 1, wherein the plurality of other lens characteristics comprise at least two of: a material, a thickness, a numerical aperture, a focal length, and a magnification.

3. The metrology tool of claim 1, wherein the on-axis curvatures are expressed as a Coddington shape factor.

4. The metrology tool of claim 1, wherein the spherochromatic aberration is a wavefront aberration and comprises spherochromatic aberration root mean square (RMS) values.

5. The metrology tool of claim 1, wherein the spherochromatic aberration of the aplanatic singlet lens is wavelength dependent, and wherein the spherochromatic aberration with the highest value across the wavelength range is taken to represent the spherochromatic aberration of the aplanatic singlet lens.

6. The metrology tool of claim 1, wherein the aplanatic singlet lens is configured to be aplanatic for an aplanatic wavelength in relation to the wavelength range; and
   wherein the aplanatic wavelength is provided at a point at which the highest spherochromatic aberration for wavelengths shorter than the aplanatic wavelength in the broadband wavelength range falls within a predetermined range of the highest spherochromatic aberration for wavelengths longer than the aplanatic wavelength in the broadband wavelength range.

7. The metrology tool of claim 1, wherein the aplanatic singlet lens is bi-aspheric.

8. The metrology tool of claim 2, wherein the material is a low-dispersion material with an Abbe number greater than 63, and wherein at least one of:
   the low dispersion material has an Abbe number greater than 90, and
   the material is one of $CaF_2$, $BaF_2$, LiF, $BaLiF_3$, $SrF_2$, $Lu_3Al_5O_{12}$, or $Y_3Al_5O_{12}$.

9. The metrology tool of claim 2, wherein at least one of:
   the numerical aperture is less than 0.95, greater than 0.2, and optionally is 0.5,
   the magnification has a magnitude from 10 to 100,
   the thickness has a value between 1 mm and 10 mm, and
   the principal focal length has a value between 1 mm and 20 mm.

10. The metrology tool of claim 1, wherein the broadband wavelength range comprises wavelengths from deep ultraviolet radiation to infrared radiation and the broadband wavelength range comprises a range from 200 nm to 2000 nm.

11. The metrology tool of claim 1, wherein the aplanatic singlet lens does not comprise an anti-reflective coating.

* * * * *